(12) United States Patent
Matsueda et al.

(10) Patent No.: US 10,862,076 B2
(45) Date of Patent: Dec. 8, 2020

(54) OLED DISPLAY DEVICE, MASK, AND METHOD OF MANUFACTURING OLED DISPLAY DEVICE

(71) Applicant: Tianma Japan, Ltd., Kanagawa (JP)

(72) Inventors: Yojiro Matsueda, Kanagawa (JP); Kenichi Takatori, Kanagawa (JP)

(73) Assignees: XIAMEN TIANMA MICRO-ELECTRONICS CO., LTD., Xiamen (CN); TIANMA JAPAN, LTD., Kanagawa (JP)

(*) Notice: Subject to any disclaimer, the term of this patent is extended or adjusted under 35 U.S.C. 154(b) by 37 days.

(21) Appl. No.: 16/173,176

(22) Filed: Oct. 29, 2018

(65) Prior Publication Data

US 2019/0131589 A1 May 2, 2019

(30) Foreign Application Priority Data

Oct. 27, 2017 (JP) .................. 2017-207847

(51) Int. Cl.
| | | |
|---|---|---|
| H01L 51/56 | (2006.01) | |
| H01L 27/32 | (2006.01) | |
| H01L 51/52 | (2006.01) | |
| G09G 3/3225 | (2016.01) | |
| C23C 14/04 | (2006.01) | |
| H01L 51/00 | (2006.01) | |

(52) U.S. Cl.
CPC ............ *H01L 51/56* (2013.01); *C23C 14/042* (2013.01); *G09G 3/3225* (2013.01); *H01L 27/3218* (2013.01); *H01L 27/3246* (2013.01); *H01L 27/3276* (2013.01); *H01L 51/0011* (2013.01); *H01L 51/524* (2013.01); *H01L 51/5221* (2013.01); *G09G 2300/0426* (2013.01); *G09G 2300/0452* (2013.01); *H01L 51/5206* (2013.01)

(58) Field of Classification Search
None
See application file for complete search history.

(56) References Cited

U.S. PATENT DOCUMENTS

| | | |
|---|---|---|
| 2014/0197385 A1 | 7/2014 | Madigan |
| 2015/0091785 A1 | 4/2015 | Lee |
| 2018/0175121 A1* | 6/2018 | Ji .......................... H01L 51/52 |

* cited by examiner

*Primary Examiner* — Michelle Mandala
(74) *Attorney, Agent, or Firm* — Nixon & Vanderhye

(57) ABSTRACT

Distances between lines passing through the centroids of pixels in each of pixel rows are uniform. In each pair consisting of two adjacent pixel rows, each pixel of the first color in first pixel row of the pair of the two pixel rows is located at the center in the first direction between pixels of the first color adjacent to each other in a second pixel row of the pair of the two pixel rows. The shortest distance between perimeters of a first pixel and a second pixel of the same color which is closest to the first pixel in an adjacent pixel row is a distance between a point where a line connecting the centroid of the first pixel and the centroid of the second pixel intersects with opposed sides of the first pixel and the second pixel.

4 Claims, 17 Drawing Sheets

OLED DISPLAY DEVICE, MASK, AND METHOD OF MANUFACTURING OLED DISPLAY DEVICE

CROSS-REFERENCE TO RELATED APPLICATIONS

This Non-provisional application claims priority under 35 U.S.C. § 119(a) on Patent Application No. 2017-207847 filed in Japan on Oct. 27, 2017, the entire content of which is hereby incorporated by reference.

BACKGROUND

This disclosure relates to an OLED display device, a mask, and a method of manufacturing an OLED display device.

In place of liquid crystal display devices, organic light-emitting diode (OLED) display devices have been proposed. The OLED element is a current-driven self-light-emitting element and therefore, eliminates the necessity of backlight. In addition to this, the OLED display element has advantages to achieve low power consumption, wide viewing angle, and high contrast ratio; it is expected to contribute to development of flat panel display devices.

An active matrix type of color OLED display device has a display region composed of red (R) pixels, green (G) pixels, and blue (B) pixels arrayed on a substrate. In view of the characteristics of the OLED display device and the manufacturing method thereof, various pixel layouts have been proposed as disclosed in US 2014/0197385 A and US 2015/0091785 A, for example.

There are two major ways of manufacturing the pixels for an OLED display device; one is color filtering method that produces three colors of R, G, and B from white OLED elements with color filters and the other is selective deposition method that applies organic light-emitting materials for the three R, G, and B colors separately. The color filtering method has a disadvantage of high power consumption because the color filters absorb light to lower the light usage rate. In contrast, the selective deposition method has advantages of high color purity to easily produce a wide color gamut and no color filters to achieve high light usage rate; accordingly, the selective deposition method is widely employed.

The selective deposition method uses sheet-like metal masks (called fine metal masks (FMM)) to selectively apply organic light-emitting materials for individual colors. An organic light-emitting material is applied (vapor-deposited) through openings provided in a metal mask to become a film. The metal mask deforms easily because of its structure.

Meanwhile, the trend toward higher definition in video or image format represented by the full HD format requires OLED display devices to have higher resolution. To manufacture an OLED display device having higher resolution and larger screen, the metal masks need to be thinner and larger, so that they deform more easily, causing a problem that selectively applying organic light-emitting materials with high precision is difficult.

SUMMARY

An aspect of the present disclosure is an OLED display device including: a plurality of pixels of a first color; a plurality of pixels of a second color; and a plurality of pixels of a third color. The plurality of pixels of the first color, the plurality of pixels of the second color, and the plurality of pixels of the third color are provided in a plurality of pixel rows. Each of the plurality of pixel rows includes pixels disposed cyclically in order of the first color, the second color, and the third color at regular distances. The plurality of pixels of the first color, the plurality of pixels of the second color, and the plurality of pixels of the third color have the same polygonal shape that is symmetric about a line passing through the centroid thereof. The centroids of the pixels in each of the plurality of pixel rows are located on a line extending in a first direction. Distances between lines passing through the centroids of the pixels in each of the plurality of pixel rows are uniform. In each pair consisting of two pixel rows adjacent to each other in the plurality of pixel rows, each of the pixels of the first color in a first pixel row of the pair of the two pixel rows is located at the center in the first direction between pixels of the first color adjacent to each other in a second pixel row of the pair of the two pixel rows. The shortest distance between a perimeter of a first pixel of each of the first color, the second color, and the third color and a perimeter of a second pixel of the same color as the first pixel that is closest to the first pixel in a pixel row adjacent to the pixel row including the first pixel is a distance between a first point and a second point, the first point being where a centroid connecting line connecting the centroid of the first pixel and the centroid of the second pixel intersects with a side of the first pixel opposed to a side of the second pixel, the second point where the centroid connecting line intersects with the side of the second pixel opposed to the side of the first pixel. The side of the first pixel and the side of the second pixel opposed to each other are perpendicular to the centroid connecting line.

It is to be understood that both the foregoing general description and the following detailed description are exemplary and explanatory and are not restrictive of this disclosure.

EMBODIMENTS

Figure 1:
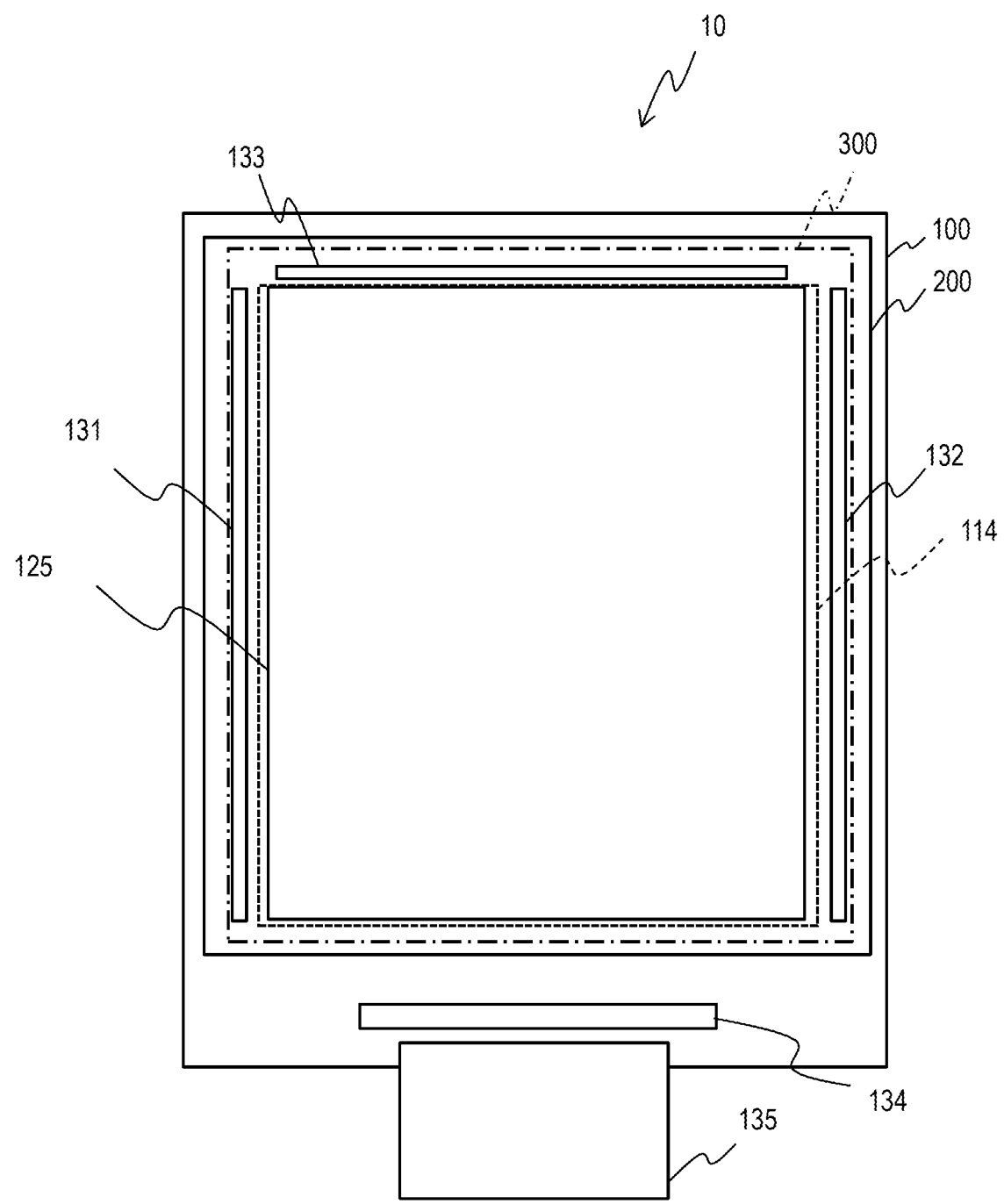
FIG. 1 schematically illustrates a configuration example of an OLED display device.

Hereinafter, embodiments of this disclosure will be described with reference to the accompanying drawings. It should be noted that the embodiments are merely examples to implement this disclosure and are not to limit the technical scope of this disclosure. Elements common to the drawings are denoted by the same reference signs.

Configuration of Display Device

An overall configuration of a display device 10 in this disclosure is described with reference to FIGS. 1 and 2. The elements in the drawings may be exaggerated in size or shape for clear understanding of the description.

FIG. 1 schematically illustrates a configuration example of an organic light-emitting diode (OLED) display device 10 in this disclosure. The OLED display device 10 includes a thin film transistor (TFT) substrate 100 on which OLED elements are formed, an encapsulation substrate 200 for encapsulating the OLED elements, and a bond (glass frit sealer) 300 for bonding the TFT substrate 100 with the encapsulation substrate 200. The space between the TFT substrate 100 and the encapsulation substrate 200 is filled with dry air and sealed up with the bond 300.

In the periphery of a cathode electrode forming region 114 outer than the display region 125 of the TFT substrate 100, a scanning driver 131, an emission driver 132, a protection circuit 133, and a driver IC 134 are provided. These are connected to the external devices via flexible printed circuits (FPC) 135.

The scanning driver 131 drives scanning lines on the TFT substrate 100. The emission driver 132 drives emission control lines to control the light emission periods of pixels. The protection circuit 133 protects the elements from electrostatic discharge. The driver IC 134 is mounted with an anisotropic conductive film (ACF), for example.

The driver IC 134 provides power and timing signals (control signals) to the scanning driver 131 and the emission driver 132 and further, provides data voltage corresponding to image data to the data lines. In other words, the driver IC has a display control function.

Next, a detailed structure of the OLED display device 10 is described. FIG. 2 schematically illustrates a part of a cross-sectional structure of the OLED display device 10. The OLED display device 10 includes a TFT substrate 100 and an encapsulation substrate (transparent substrate) 200 opposed to the TFT substrate 100. The definitions of top and bottom in the following description correspond to the top and the bottom of the drawing.

Figure 2:
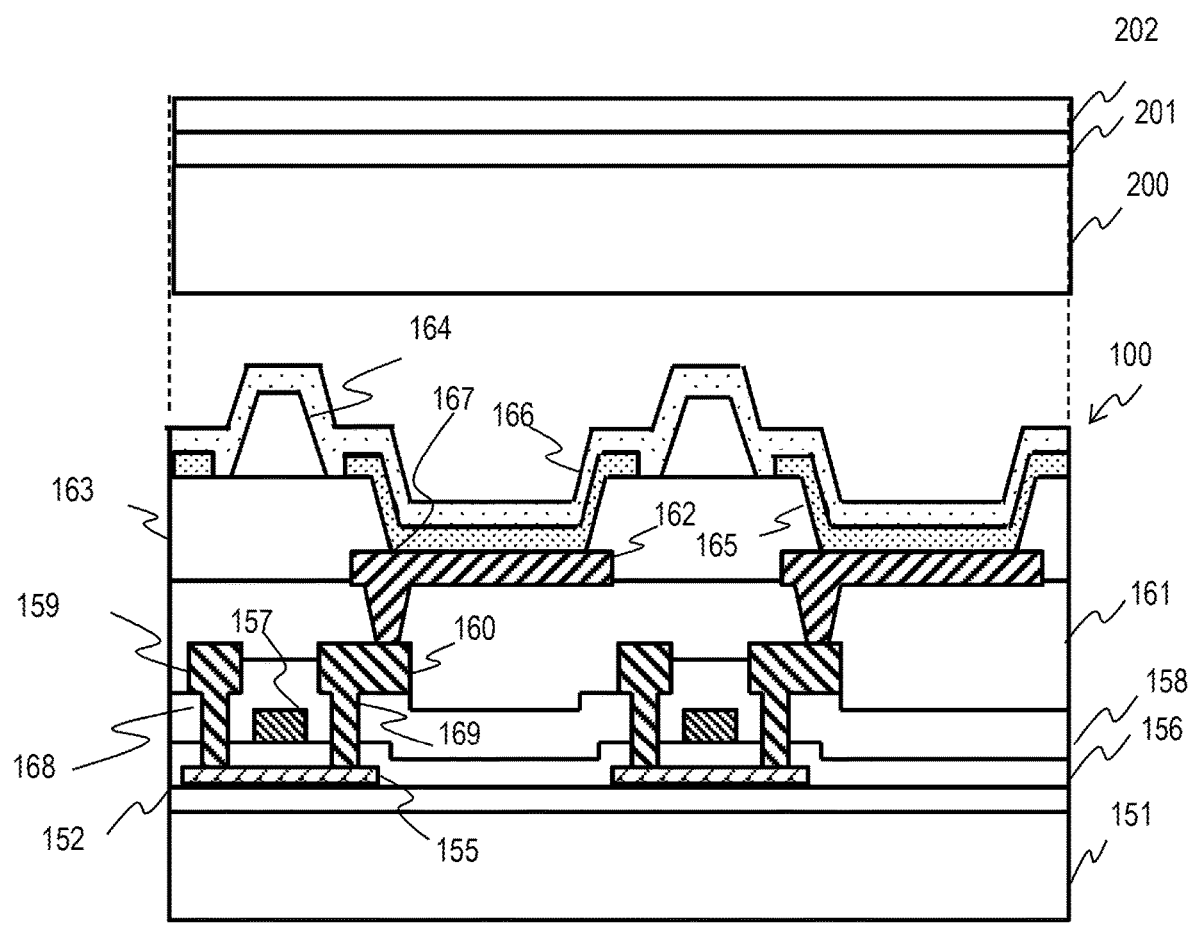
FIG. 2 schematically illustrates a part of a cross-sectional structure of an OLED display device.

As illustrated in FIG. 2, the OLED display device 10 includes an insulating substrate 151 and an encapsulation structural unit opposed to the insulating substrate 151. An example of the encapsulation structural unit is a flexible or inflexible encapsulation substrate 200. The encapsulation structural unit can be a thin film encapsulation (TFE) structure, for example.

The OLED display device 10 includes a plurality of lower electrodes (for example, anode electrodes 162), one upper electrode (for example, a cathode electrode 166), and a plurality of organic light-emitting layers 165 disposed between the insulating substrate 151 and the encapsulation structural unit. The cathode electrode 166 is a transparent electrode that transmits the light from the organic light-emitting layers 165 (also referred to as organic light-emitting films 165) toward the encapsulation structural unit.

An organic light-emitting layer 165 is disposed between the cathode electrode 166 and an anode electrode 162. The plurality of anode electrodes 162 are disposed on the same plane (for example, on a planarization film 161) and an organic light-emitting layer 165 is disposed on an anode electrode 162.

The OLED display device 10 further includes a plurality of spacers 164 standing toward the encapsulation structural unit and a plurality of circuits each including a plurality of switches. Each of the plurality of circuits is formed between the insulating substrate 151 and an anode electrode 162 and controls the electric current to be supplied to the anode electrode 162.

FIG. 2 illustrates an example of a top-emission pixel structure. The top-emission pixel structure is configured in such a manner that the cathode electrode 166 common to a plurality of pixels is provided on the light emission side (the upper side of the drawing). The cathode electrode 166 has a shape that fully covers the entire display region 125. The features of this disclosure are also applicable to an OLED display device having a bottom-emission pixel structure. The bottom-emission pixel structure has a transparent anode electrode and a reflective cathode electrode to emit light to the external through the TFT substrate 100.

Hereinafter, the OLED display device 10 is described in more detail. The TFT substrate 100 includes pixels (also called sub-pixels) arrayed within the display region and lines provided in the wiring region surrounding the display region. The lines connect the pixel circuits with the control circuits (131, 132, 134) provided in the wiring region.

A pixel is a light emitting region for displaying one of the colors of red, green, and blue. The light emitting region is included in an OLED element, which is composed of an anode electrode of a lower electrode, an organic light-emitting layer, and a cathode electrode of an upper electrode. A plurality of OLED elements are formed of one cathode electrode 166, a plurality of anode electrodes 162, and a plurality of organic light-emitting layers 165.

The insulating substrate 151 is made of glass or resin, for example, and is flexible or inflexible. In the following description, the side closer to the insulating substrate 151 is defined as lower side and the side farther from the insulating substrate 151 is defined as upper side. An insulating film 152 is formed on the insulating substrate 151. Channels 155 are formed on the insulating substrate 151. Gate electrodes 157 are provided above the channels 155 with a gate insulating film 156 interposed. An interlayer insulating film 158 is provided over the gate electrodes 157.

Within the display region 125, source electrodes 159 and drain electrodes 160 are provided above the interlayer insulating film 158. The source electrodes 159 and the drain electrodes 160 are formed of a metal having a high melting point or an alloy of such a metal. Each source electrode 159 and each drain electrode 160 are connected with the channel 155 through contacts 168 and 169 provided in contact holes of the interlayer insulating film 158.

Over the source electrodes 159 and the drain electrodes 160, an insulative planarization film 161 is provided. Above the insulative planarization film 161, anode electrodes 162 are provided. Each anode electrode 162 is connected with a drain electrode 160 through a contact provided in a contact hole in the planarization film 161. The pixel circuits (TFTs) are formed below the anode electrodes 162.

Above the anode electrodes 162, an insulative pixel defining layer (PDL) 163 is provided to separate OLED elements. An OLED element is composed of an anode electrode 162, an organic light-emitting layer 165, and the cathode electrode 166 (a part thereof) laminated together. The light emitting region of an OLED element is formed in an opening 167 of the pixel defining layer 163.

Each insulative spacer 164 is provided on the pixel defining layer 163 and between anode electrodes 162. The top face of the spacer 164 is located higher than the top face of the pixel defining layer 163 or closer to the encapsulation substrate 200 and maintains the space between the OLED elements and the encapsulation substrate 200 by supporting the encapsulation substrate 200 when the encapsulation substrate 200 is deformed.

Above each anode electrode 162, an organic light-emitting layer 165 is provided. The organic light-emitting layer 165 is in contact with the pixel defining layer 163 in the opening 167 of the pixel defining layer 163 and its periphery. A cathode electrode 166 is provided over the organic light-emitting layer 165. The cathode electrode 166 is a transparent electrode. The cathode electrode 166 transmits all or part of the visible light from the organic light-emitting layer 165.

The laminated film of the anode electrode 162, the organic light-emitting layer 165, and the cathode electrode 166 formed in an opening 167 of the pixel defining layer 163 corresponds to an OLED element. Electric current flows only within the opening 167 of the pixel defining layer 163 and accordingly, the region of the organic light-emitting layer 165 exposed in the opening 167 is the light emitting region of the OLED element (pixel). The cathode electrode 166 is common to the anode electrodes 162 and the organic light-emitting layers 165 (OLED elements) that are formed separately. A not-shown cap layer may be provided over the cathode electrode 166.

The encapsulation substrate 200 is a transparent insulating substrate, which can be made of glass. A λ/4 plate 201 and a polarizing plate 202 are provided over the light emission surface (top face) of the encapsulation substrate 200 to prevent reflection of light entering from the external.

Manufacturing Method

An example of a method of manufacturing the OLED display device 10 is described. In the following description, the elements formed in the same process (simultaneously) are the elements on the same layer. The method of manufacturing the OLED display device 10 first deposits silicon nitride, for example, onto the insulating substrate 151 by chemical vapor deposition (CVD) to form a first insulating film 152.

Next, the method forms a layer (poly-silicon layer) including channels 155 by a known low-temperature poly-silicon TFT fabrication technique. For example, the method can form the poly-silicon layer by depositing amorphous silicon by CVD and crystalizing the amorphous silicon by excimer laser annealing (ELA). The poly-silicon layer is used to connect elements within the display region 125.

Next, the method deposits silicon oxide, for example, onto the poly-silicon layer including the channels 155 by CVD to form a gate insulating film 156. Furthermore, the method deposits a metal by sputtering and patterns the metal to form a metal layer including gate electrodes 157.

The metal layer includes storage capacitor electrodes, scanning lines, emission control lines, and power lines, in addition to the gate electrodes 157. The metal layer may be a single layer made of one material selected from a group consisting of Mo, W, Nb, MoW, MoNb, Al, Nd, Ti, Cu, a Cu alloy, an Al alloy, Ag, and an Ag alloy. Alternatively, the metal layer may be a laminated layer to reduce the wiring resistance. The laminated layer has a multi-layer structure including two or more layers each made of a low-resistive material such as Mo, Cu, Al, Ag or an alloy thereof.

Next, the method dopes additional impurities to the channels 155 doped with high-concentration impurities before formation of the gate electrodes 157, using the gate electrodes 157 as a mask. As a result, a layer of low-concentration impurities is formed and the TFTs are provided with lightly doped drain (LDD) structure. Next, the method deposits silicon oxide by CVD to form an interlayer insulating film 158.

The method opens contact holes in the interlayer insulating film 158 and the gate insulating film 156 by anisotropic etching. The contact holes for the contacts 168 and 169 to connect the source electrodes 159 and the drain electrodes 160 to the channels 155 are formed in the interlayer insulating film 158 and the gate insulating film 156.

Next, the method deposits an aluminum alloy such as Ti/Al/Ti by sputtering and patterns the alloy to form a metal layer. The metal layer includes source electrodes 159, drain electrodes 160, and contacts 168 and 169. In addition to these, data lines and power lines are also formed.

Next, the method deposits a photosensitive organic material to form a planarization film 161. Subsequently, the method opens contact holes for connecting to the source electrodes 159 and the drain electrodes 160 of the TFTs. The method forms anode electrodes 162 on the planarization film 161 having contact holes. An anode electrode 162 includes three layers of a transparent film made of ITO, IZO, ZnO, $In_2O_3$, or the like, a reflective film made of Ag, Mg, Al, Pt, Pd, Au, Ni, Nd, Ir, Cr, or a metallic compound thereof, and another transparent film as mentioned above. The three-layer structure of the anode electrode 162 is an example and the anode electrode 162 may have a two-layer structure. The anode electrodes 162 are connected to the drain electrodes 160 through contacts.

Next, the method deposits a photosensitive organic resin by spin coating and patterns the photosensitive organic resin to form a pixel defining layer 163. The patterning creates holes in the pixel defining layer 163 to expose the anode electrodes 162 of the pixels at the bottom of the created holes. The pixel defining layer 163 forms separate light emitting regions of pixels. The method further deposits a photosensitive organic resin by spin coating and patterns the photosensitive organic resin to form spacers 164 on the pixel defining layer 163.

Next, the method applies organic light-emitting materials onto the insulating substrate 151 with the pixel defining layer 163 provided to form organic light-emitting layers 165. The organic light-emitting layers 165 are formed by depositing organic light-emitting materials for the individual colors of R, G, and B selectively onto the anode electrodes 162. Forming the organic light-emitting layers 165 uses fine metal masks (FMMs). The FMM can be simply called a metal mask.

An FMM is prepared for a pattern of the pixels of a specific color and a plurality of FMMs are prepared for different colors. The method places and attaches an FMM onto the surface of the TFT substrate 100 in correct alignment. The method evaporates an organic light-emitting material to be deposited onto the places corresponding to the pixels on the TFT substrate 100 through the openings of the FMM. The FMM and the vapor deposition using the FMM will be described later in detail.

Next, the method applies a metal material for the cathode electrode 166 onto the TFT substrate 100 where the pixel defining layer 163, the spacers 164, and the organic light-emitting layers 165 (in the openings of the pixel defining layer 163) are exposed. The metal material adheres to the pixel defining layer 163, the spacers 164 and the organic light-emitting layers 165. The metal material deposited on the organic light-emitting layer 165 of one pixel functions as the cathode electrode 166 of the pixel.

The layer of the transparent cathode electrode 166 is formed by vapor deposition of Li, Ca, LiF/Ca, LiF/Al, Al, Mg, or an alloy thereof, for example. The film thickness of the cathode electrode 166 is optimized to achieve high light-extraction efficiency and good viewing angle dependence. If the resistance of the cathode electrode 166 is so high to impair the uniformity of the luminance of the emitted light, an auxiliary electrode layer may be added using a material for a transparent electrode, such as ITO, IZO, ZnO, or $In_2O_3$. To increase the light extraction efficiency, a cap layer may be formed by depositing an insulator having a higher refractive index than glass, after forming the cathode electrode 166.

Through the foregoing processes, OLED elements corresponding to R, G, and B pixels are formed; the regions where the anode electrodes 162 are in contact with the organic light-emitting layers 165 (in the openings in the pixel defining layer 163) become R light emitting regions (R pixels), G light emitting regions (G pixels), and B light emitting regions (B pixels).

Next, the method applies glass frit to the periphery of the TFT substrate 100, places an encapsulation substrate 200 thereon, and heats and melts the glass frit with a laser beam to seal the TFT substrate 100 and the encapsulation substrate 200. Thereafter, the method forms a λ/4 plate 201 and a polarizing plate 202 on the light emission side of the encapsulation substrate 200 to complete the fabrication of the OLED display device 10.

Hereinafter, details of the vapor deposition of an organic light-emitting layer are described. The manufacturing system for the OLED display device 10 selectively deposits organic light-emitting materials with FMMs. The manufacturing system sets FMMs having openings a little larger than light emitting regions one after another on the TFT substrate 100 in correct alignment to selectively deposit the organic light-emitting materials for individual colors. Since the electric current flows only within the openings of the pixel defining layer 163, these regions become light emitting regions (pixels).

Figure 3A:
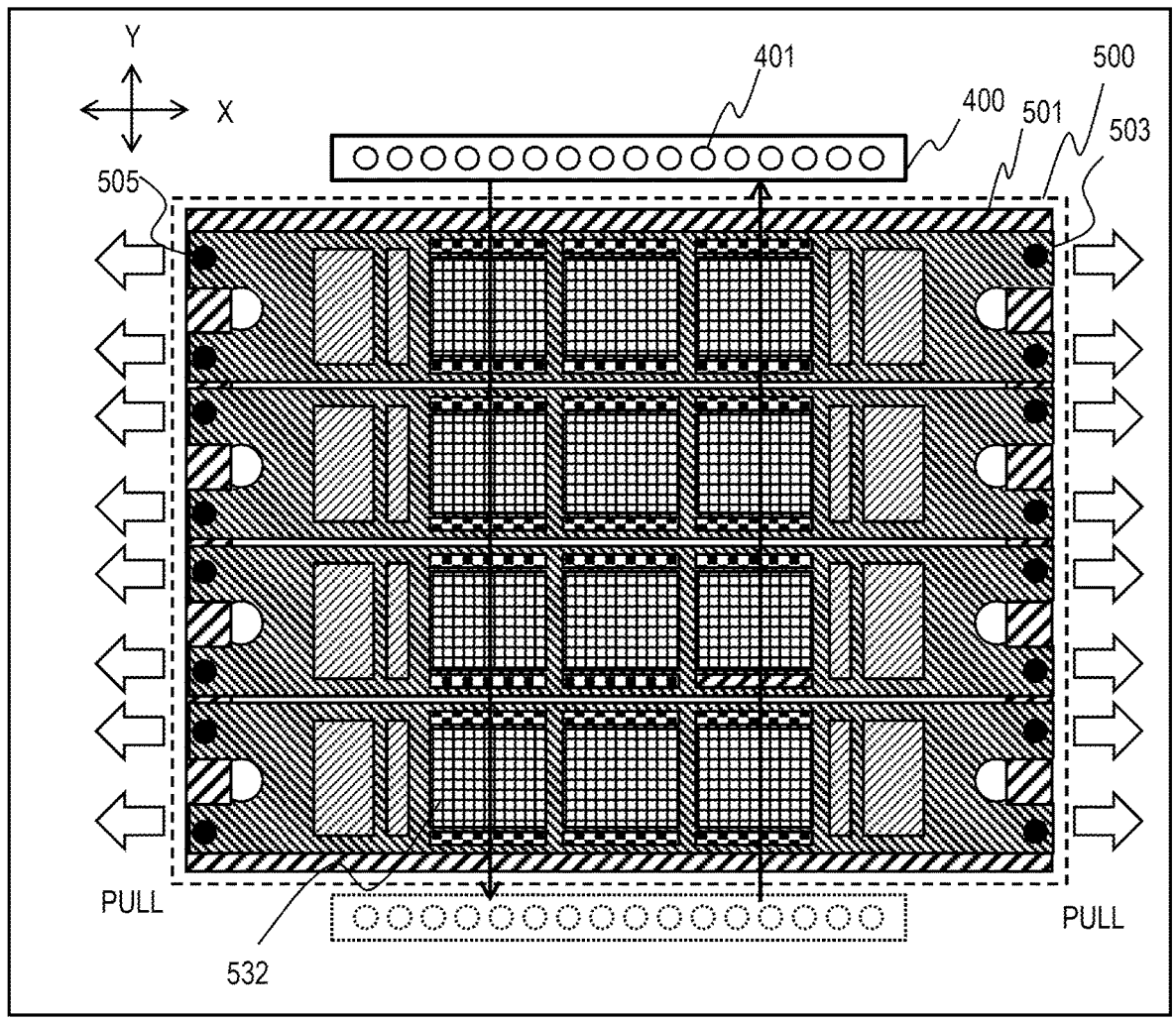
FIG. 3A schematically illustrates a configuration example of a fine metal mask (FMM) module and a linear source to be used in vapor deposition of an organic light-emitting layer.

FIG. 3A schematically illustrates a configuration example of an FMM module 500 and a linear source 400 to be used in vapor deposition of an organic light-emitting layer. The FMM module 500 is used to deposit an organic light-emitting material onto a motherboard including the panels for a plurality of OLED display devices. The panel for each OLED display device is cut out from the motherboard.

The FMM module 500 includes a frame 501 and a plurality of strip-like FMMs 503. For example, the frame 501 has a rectangular shape and consists of parts corresponding to four sides to surround a central opening. The frame 501 is structured to have sufficient stiffness and small thermal deformability to hold stretched FMM 503 with high precision. To achieve small thermal deformation, the frame 501 is formed of Invar, for example. The shape and the material of the frame 501 depends on the design.

In FIG. 3A, each of the plurality of FMMs 503 is secured to the frame 501 in the state where the FMM 503 is stretched longitudinally (along the X-axis). Each FMM 503 is secured to the frame 501 at the fixing points 505 on the four corners. In securing the FMM 503 to the frame 501, the FMM 503 is being pulled in the longitudinal direction (along the X-axis). The tension reduces the deformation of the FMM 503. The FMM 503 can be made of nickel, a nickel alloy, or a nickel-cobalt alloy, for example. The material of the FMM 503 depends on the design.

A plurality of FMMs 503, four FMMs 503 in FIG. 3A, are disposed along the axis (the Y-axis) perpendicular to the direction of pull (the X-axis direction). The number of the FMMs 503 can be any, but not less than one.

Each FMM 503 has a plurality of mask patterns 532. In the example of FIG. 3A, each FMM 503 has three mask patterns 532 disposed along the longitudinal axis (the X-axis). One mask pattern 532 corresponds to the pattern of pixels for one color in the active area of one OLED display device 10. The number of mask patterns 532 in one FMM 503 can be any, but not less than one.

The linear source 400 has multiple nozzles 401 disposed linearly along the longitudinal axis (the X-axis). The linear source 400 moves back and forth along the axis (the Y-axis) perpendicular to the disposition of the nozzles 401 over the FMM module 500 to vapor-deposit the organic light-emitting material from the nozzles 401 onto the motherboard.

The direction of movement of the linear source 400 (the Y-axis direction) is perpendicular to the direction of pulling the FMM 503 (the X-axis direction). In the alignment of the FMM 503, the error is large in the direction of pull (the X-axis direction) and small in the direction perpendicular thereto (the Y-axis direction). Accordingly, the linear source 400 moves perpendicularly to the direction of pull (moves along the Y-axis). All mask patterns 532 of each FMM 503 are provided between the nozzles 401 at the both ends in the X-axis direction. The linear source 400 moves along the Y-axis to deposit the organic light-emitting material onto the motherboard through all mask patterns 532.

Figure 3B:
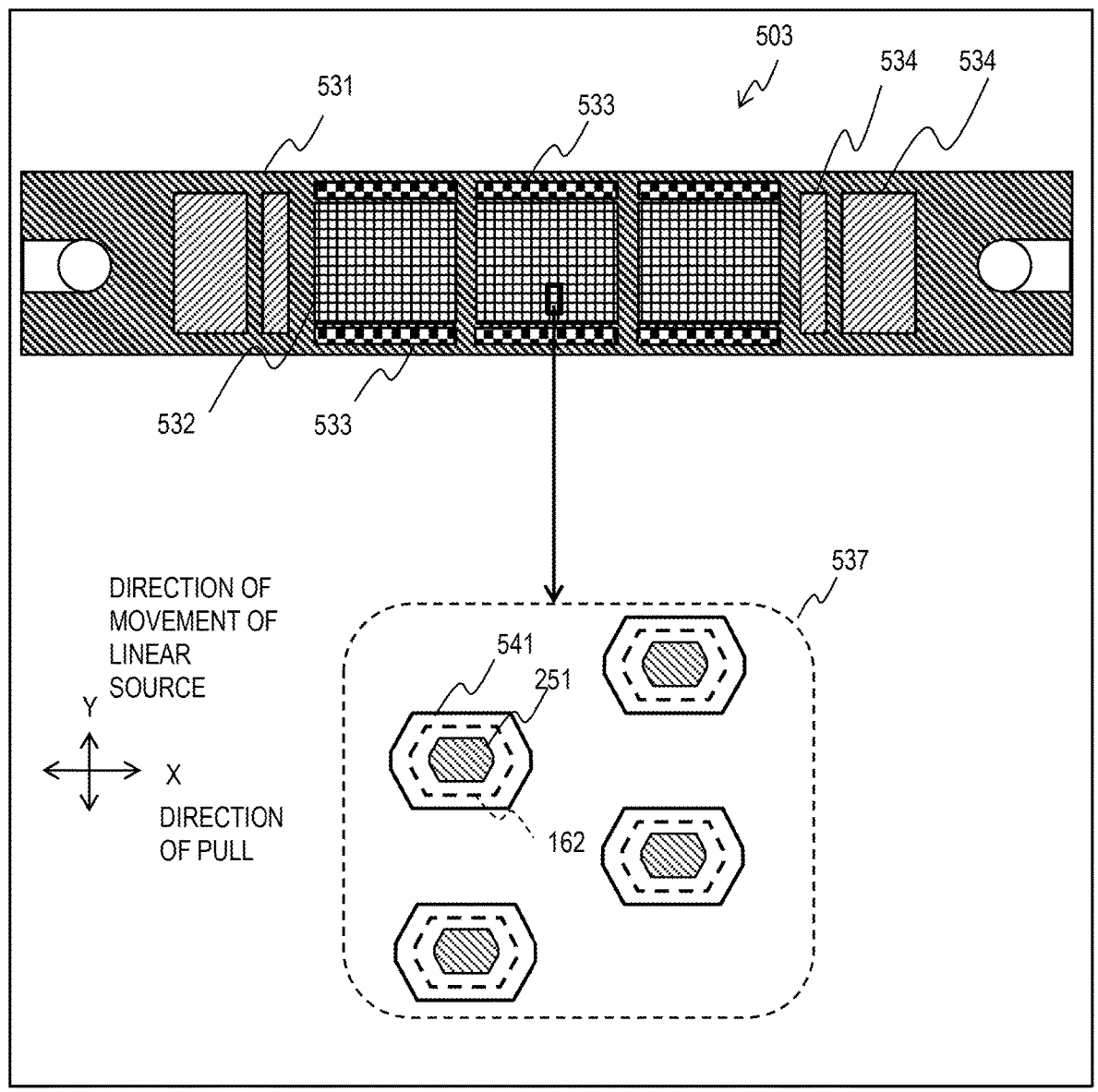
FIG. 3B schematically illustrates a configuration example of an FMM.

FIG. 3B schematically illustrates a configuration example of an FMM 503. The orientations of the X-axis and the Y-axis in FIG. 3B are the same as those in FIG. 3A. The FMM 503 has a substantially rectangular shape. The FMM 503 is pulled in the longitudinal direction (along the X-axis) and secured to the frame 501. The FMM 503 includes a substrate body 531 and multiple mask patterns 532 disposed along the longitudinal axis (the X-axis). In the example of FIG. 3B, three mask patterns 532 are provided.

Each mask pattern 532 is an opening pattern for the active area of one OLED display device 10. The mask pattern 532 corresponds to the pattern of the R, G, or B pixels in the active area. The mask pattern 532 is composed of openings provided correspondingly to the pixel array and a masking part surrounding the openings. Each opening corresponds to a pixel; the organic light-emitting material that passes through the opening adheres to the anode electrode 162 of the corresponding pixel.

The FMM 503 further includes a plurality of dummy patterns 533 and a plurality of half-etched regions 534. In FIG. 3B, only two of the six dummy patterns are provided with a reference sign 533 by way of example. Each pair of the three pairs of dummy patterns 533 are provided to sandwich a mask pattern 532 in the Y-axis direction.

In FIG. 3B, only two of four half-etched regions are provided with a reference sign 534 by way of example. The half-etched regions 534 are formed to sandwich the mask patterns 532 in the X-axis direction. Two half-etched regions 534 are formed on one side and the other two half-etched regions 534 are formed on the other side. The dummy patterns 533 and the half-etched regions 534 are formed so that the FMM 503 is stretched uniformly in response to pulling. Whether to provide the dummy patterns 533 and the half-etched regions 534, and the numbers, the locations, and the shapes of the dummy patterns 533 and the half-etched regions 534 are selectable depending on the design.

The region 537 is an enlarged view of a part of a mask pattern 532. FMM openings 541 are formed regularly to correspond to the pixel array. The anode electrodes 162 of the pixels are exposed at the FMM openings 541. The organic light-emitting material passes through the FMM openings 541 and adheres to the anode electrodes 162 within the openings 167 of the pixel defining layer 163. The regions of the organic light-emitting material above the anode electrodes 162 are the light emitting regions, namely the pixels 251.

Layout of Pixels and FMM Openings

Figure 4:
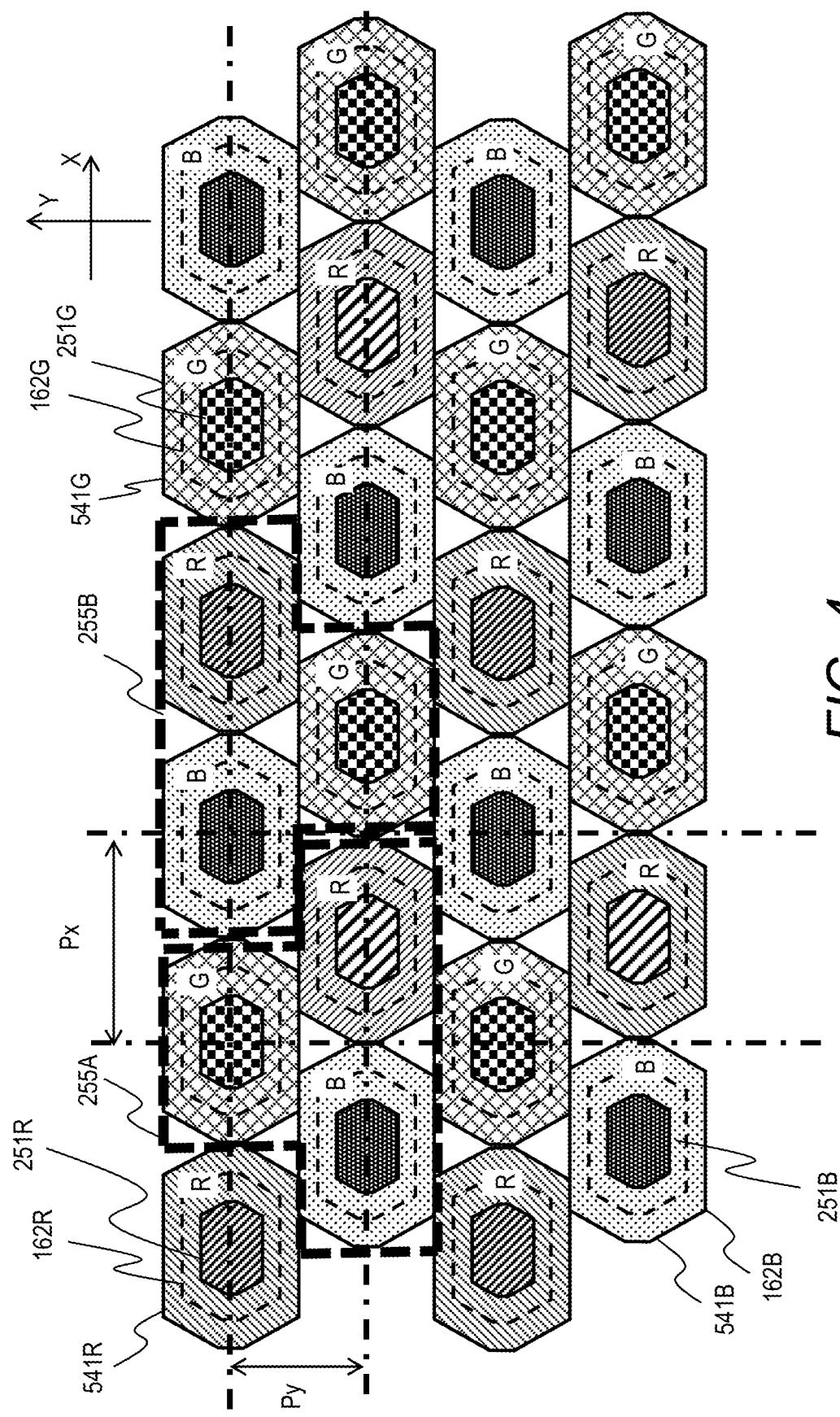
FIG. 4 illustrates an example of a pixel layout.

FIG. 4 illustrates an example of the pixel layout of this disclosure. FIG. 4 illustrates a relation of the layout of pixels (light emitting regions), the layout of anode electrodes 162, and the layout of openings of three FMMs to be used in vapor deposition of organic light-emitting layers 165. As described above, different FMMs are prepared for individual colors of R, G, and B; patterns of the organic light-emitting layer for each color are formed on the substrate by vapor deposition through the openings of each FMM. FIG. 4 includes opening patterns of three FMMs. The concept of this disclosure is applicable to pixels of a color group different from the color group of R, G, and B.

FIG. 4 includes four pixel rows by way of example. Each pixel row is composed of pixels disposed in the X-axis direction (first direction) in FIG. 4. The direction in which the pixels constituting a pixel row are disposed is also referred to as row direction. A plurality of pixel rows are disposed in the column direction (second direction) which is perpendicular to the row direction. In FIG. 4, the Y-axis direction corresponds to the column direction.

Each pixel row is composed of a plurality of R pixels 251R, a plurality of G pixels 251G, and a plurality of B pixels 251B. In FIG. 4, one R pixel 251R, one G pixel 251G, and one B pixel 251B are provided with reference signs by way of example.

In each pixel row, pixels of three colors are cyclically disposed at regular distances (pitch) Px. In the example of FIG. 4, the pixels constituting a pixel row are disposed cyclically in the order of an R pixel 251R, a G pixel 251G, and a B pixel 251B. In the cyclic disposition, the colors of the pixels on both sides are common to the pixels of the same color and the distances between pixels of the same color adjacent to each other are the same 3Px. The distance between adjacent pixels of the same color is common to the pixels of each color. The order of color is common to all pixel rows.

In the example of FIG. 4, the R pixels 251R, the G pixels 251G, and the B pixels 251B have the same shape. Specifically, each pixel has an octagonal shape symmetric about a given line passing through its centroid and two sides thereof are parallel to the row direction. The centroids of the pixels constituting a pixel row are located on a straight line extending in the row direction. The pixel pitch Px in a pixel row corresponds to the distance between the centroids of pixels adjacent to each other.

A plurality of pixel rows are disposed at regular distances (pitch) Py in the column direction. The pitch Py is a distance between lines passing through the centroids of the pixels in two pixel rows adjacent to each other. The pixel layout is a staggered arrangement. The locations and the colors of the pixels in the pixel row are the same among the odd-numbered pixel rows. In similar, the locations and the colors of the pixels in the pixel row are the same among the even-numbered pixel rows.

Each pixel row is different in position with respect to its adjacent pixel rows by (3/2)Px. In each pixel row, a pixel is located at the center between pixels of the same color adjacent to each other in each of the two adjacent pixel rows. Specifically, the centroid of a pixel is located at the center between the centroids of pixels of the same color adjacent to each other in each of the two adjacent pixel rows.

For example, one R pixel 251R is located at the center between two R pixels 251R adjacent to each other in a pixel row adjacent to the pixel row including the R pixel 251R. In similar, one G pixel 251G or one B pixel 251B is located at the center between two G pixels 251R adjacent to each other or two B pixels 251B adjacent to each other in a pixel row adjacent to the G pixel 251G or the B pixel 251B.

FIG. 4 provides a pixel layout for real resolution. Each pixel of a displayed image (also referred to as display pixel or main pixel) is composed of an R pixel 251R, a G pixel 251G and a B pixel 251B adjacent to one another. In FIG. 4, two display pixels 255A and 255B are provided with reference signs by way of example.

The display pixel 255A has a delta (triangular) shape. Specifically, the display pixel 255A consists of a G pixel 251G in the k-th row (k is a natural number) and an R pixel 251R and a B pixel 251B in the (k+1)th row. The display pixel 255B has a nabla (inverted-triangular) shape. Specifically, the display pixel 255B consists of an R pixel 251R and a B pixel 251B in the k-th row (k is a natural number) and a G pixel 251G in the (k+1)th row. FIG. 4 provides so-called delta-nabla arrangement of display pixels. The delta-nabla arrangement has a configuration in which display pixels 255A having a delta shape and display pixels 255B having a nabla shape are disposed alternately.

The anode electrodes 162 of the pixels are larger than the pixels (openings 167 of the pixel defining layer) and have similar shapes (outlines) to the pixels. Specifically, the anode electrode 162R of an R pixel 251R is larger than the R pixel 251R and has an octagonal shape similar to the R pixel 251R. In similar, the anode electrode 162G of a G pixel 251G and the anode electrode 162B of a B pixel 251B are larger than the G pixel 251G and the B pixel 251B, respectively, and have octagonal shapes similar to the G pixel 251G and the B pixel 251B, respectively. The ratio of a pixel to the anode electrode thereof is common to all pixels.

The centroids of the pixel and its anode electrode are located at the same points when seen in the stacking direction. In other words, the centroids of an R pixel 251R, a G pixel 251G, and a B pixel 251B are located at the same points as the centroids of their anode electrodes 162R, 162G, and 162B, respectively, when seen in the stacking direction. As understood from the foregoing description about the relation between pixels and their anode electrodes, the description about the pixels and pixel rows is applicable to the anode electrodes and the rows of anode electrodes.

The openings of an FMM to deposit an organic light-emitting material of pixels are larger than the pixels (openings 167 of the pixel defining layer) and the anode electrodes and have similar shapes (similar outlines) to the pixels. Specifically, the FMM opening 541R for an R pixel 251R is larger than the R pixel 251R and its anode electrode 162R and has an octagonal shape similar to the R pixel 251R.

In similar, the FMM opening 541G for a G pixel 251G is larger than the G pixel 251G and its anode electrode 162G and has an octagonal shape similar to the G pixel 251G. Furthermore, the FMM opening 541B for a B pixel 251B is larger than the B pixel 251B and its anode electrode 162B and has an octagonal shape similar to the B pixel 251B. The ratio of a pixel to the FMM opening therefor is common to all pixels.

FIG. 4 provides a pixel layout and an FMM opening layout in which the centroids of the pixels are located at the same points as the centroids of the FMM openings for the pixels when seen in the stacking direction. FIG. 4 includes an opening layout of three FMMs: an FMM for R pixels, an FMM for G pixels, and an FMM for B pixels. The centroids of R pixels 251R, G pixels 251G, and B pixels 251B are located at the same points as the centroids of FMM openings 541R, 541G, and 541B, respectively, when seen in the stacking direction.

As understood from the foregoing description about the relation between the pixels and the FMM openings, the description about the pixels and pixel rows is applicable to the FMM openings and the rows of FMM openings. Each FMM, for example the FMM for R pixels, is provided with a plurality of FMM openings 541R and the plurality of FMM openings 541 are disposed in a plurality of rows. The row direction of the FMM openings 541 is the X-axis direction.

Each row of FMM openings 541R is composed of FMM openings 541R disposed at regular distances. The pitch of the FMM openings 541R corresponds to the distance between the centroids of FMM openings 541R adjacent to each other in the row and is 3Px. Each FMM opening 541R has an octagonal shape symmetric about a given line passing through its centroid and all FMM openings 541R have the same shape. The centroids of the FMM openings 541R in a row are located on a line extending in the X-axis direction.

In each FMM, for example in the FMM for R pixels, the rows of FMM openings 541R are disposed in the column direction (Y-axis direction) at regular distances Py. In other words, the distances between lines passing through the centroids of the FMM openings in individual rows of FMM openings 541R are the same Py. The layout of the FMM openings 541R is a staggered arrangement.

Each row is different in position with respect to its adjacent rows by (3/2)Px. In each row, an FMM opening 541R is located at the center between FMM openings 541R adjacent to each other in each of the two adjacent rows. Specifically, the centroid of an FMM opening 541R is located at the center between the centroids of FMM openings 541R adjacent to each other in each of the two adjacent rows.

The FMM opening can be smaller than the anode electrode of the corresponding pixel. In actual manufacture, the centroids of the FMM openings positioned onto the substrate 151 for vapor deposition of an organic light-emitting material are not always located at the centroids of the pixels. The ratio of a pixel to the FMM opening therefor is determined depending on the margin required in the manufacturing process.

Figure 5:
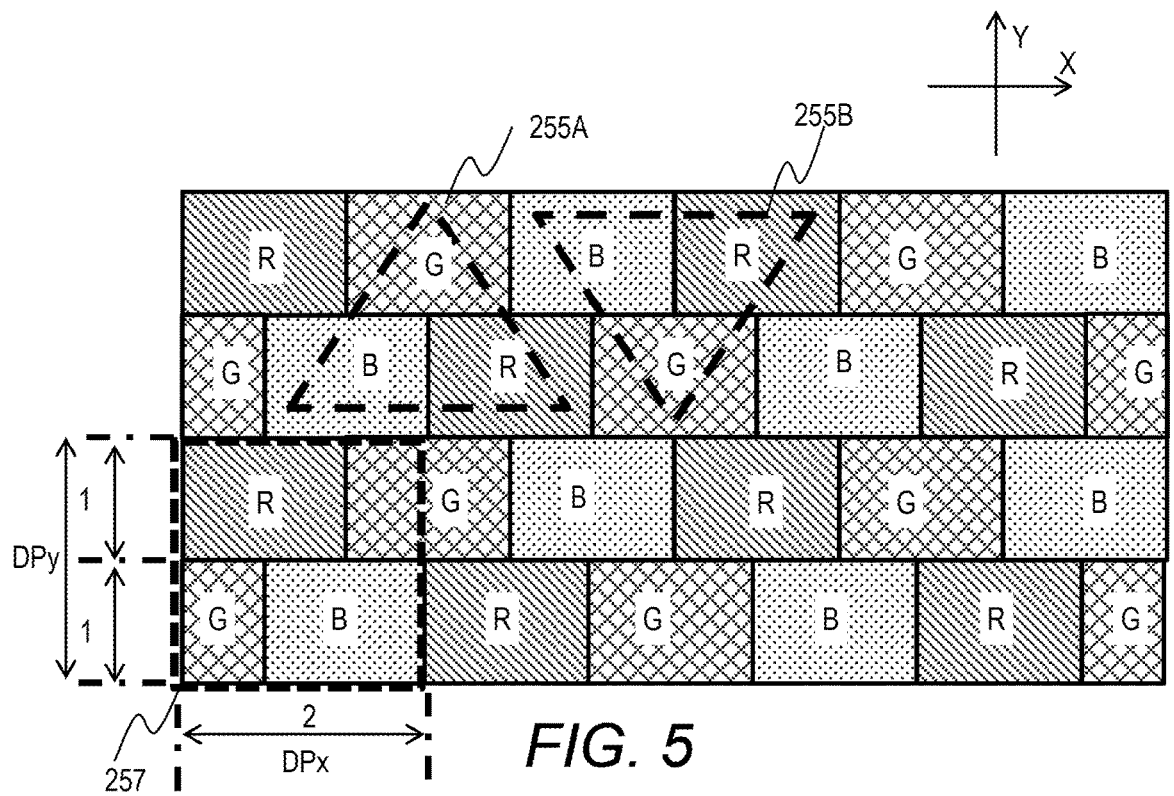
FIG. 5 illustrates a color pattern of the pixels in delta-nabla arrangement for real resolution.

FIG. 5 illustrates a color pattern of the pixels in the delta-nabla arrangement for real resolution. A delta display pixel 255A consists of an R pixel 251R, a G pixel 251G, and a B pixel 251B and has a triangular (delta) shape in which the G pixel 251G is located at the center. A nabla display pixel 255B consists of an R pixel 251R, a G pixel 251G, and a B pixel 251B and has an inverted-triangular (nabla) shape in which the G pixel 251G is located at the center.

The display pixel pitch DPx in the row direction is equal to the display pixel pitch DPy in the column direction. Accordingly, the colors of R, G, and B are balanced in a square as indicated by the square 257 surrounded by a dashed line.

Figure 6:
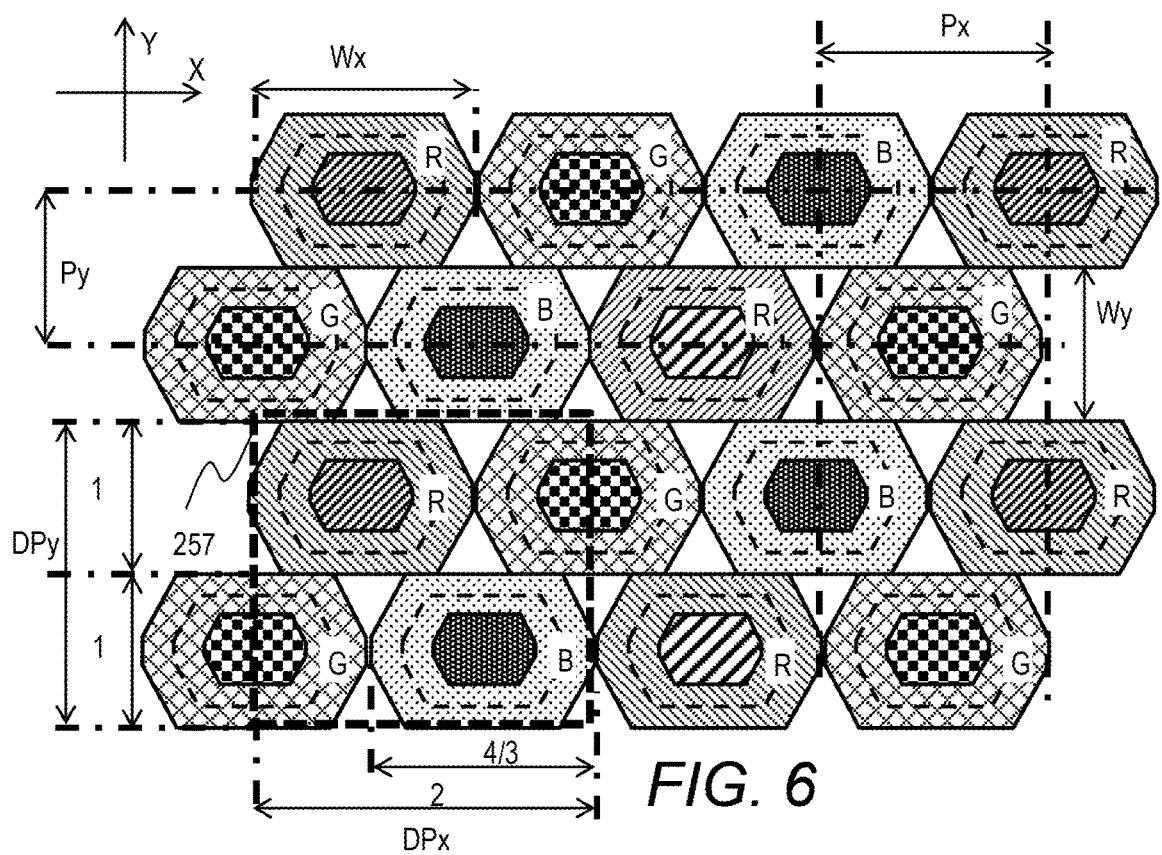
FIG. 6 illustrates a relation among the row direction display pixel pitch DPx, the column direction display pixel pitch DPy, the row direction pixel pitch Px, and the column direction pixel pitch Py in the pixel layout of the octagonal pixels illustrated in FIG. 4.

FIG. 6 illustrates a relation among the row direction display pixel pitch DPx, the column direction display pixel pitch DPy, the row direction pixel pitch Px, and the column direction pixel pitch Py in the pixel layout of the octagonal pixels illustrated in FIG. 4. The row direction pixel pitch Px is ⅔ of the row direction display pixel pitch DPx.

The column direction pixel pitch Py is ½ of the column direction display pixel pitch Dpy (Dpx). The ratio of the row direction pixel pitch Px to the column direction pixel pitch Py is 4/3 to 1. In the example of FIG. 6, the length Wx in the row direction of an FMM opening is equal to the row direction pixel pitch Px. The length Wy in the column direction of an FMM opening is equal to the column direction pixel pitch Py. The center between the centroids of pixels adjacent in the row direction and the center between the centroids of pixels adjacent in the column direction are located on the perimeter of an FMM opening.

Figure 7:
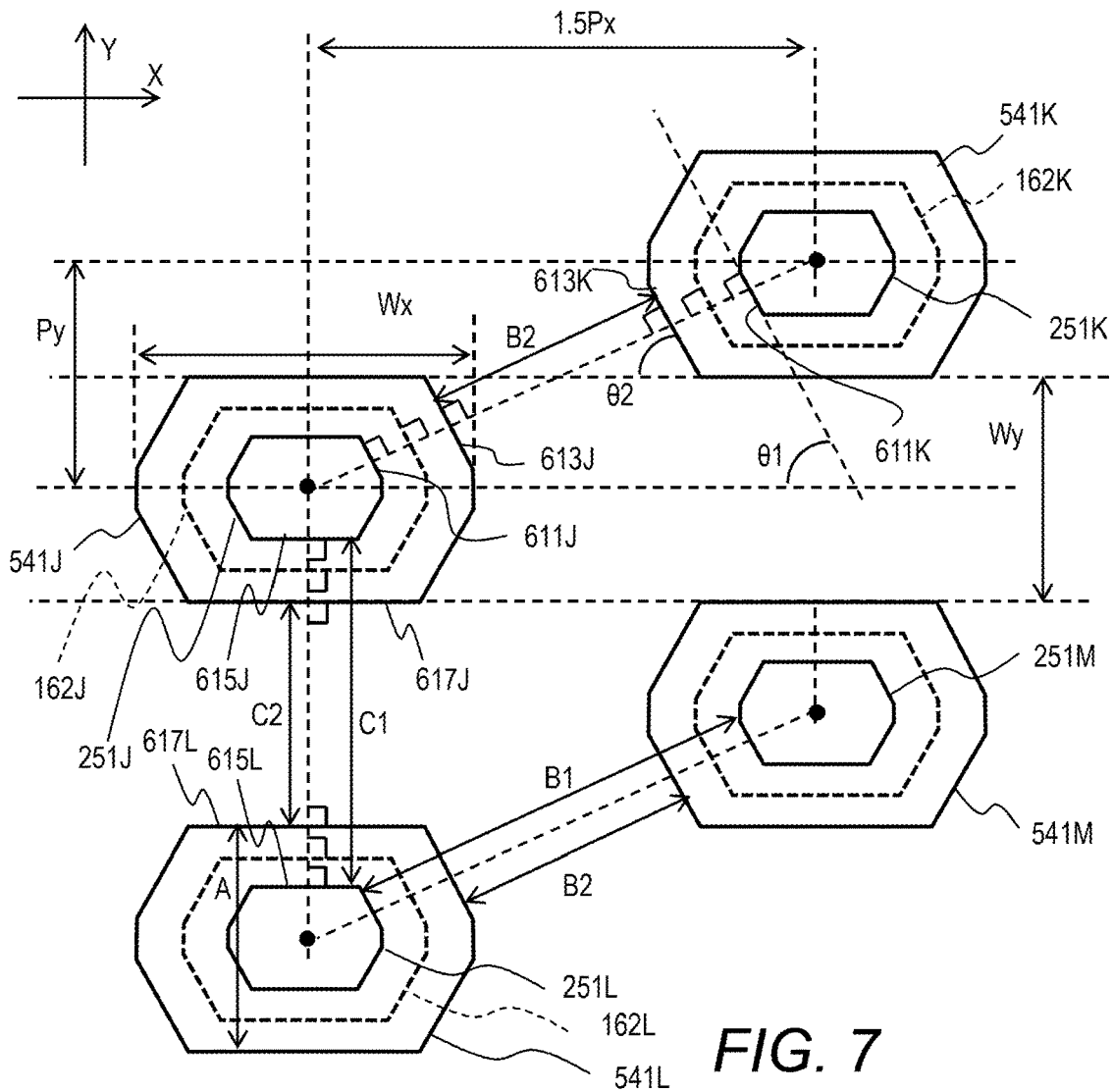
FIG. 7 illustrates a layout of pixels of one of the colors of red, green, and blue, anode electrodes thereof, and FMM openings therefor.

FIG. 7 illustrates a layout of pixels of one of the colors of red, green, and blue, anode electrodes thereof, and FMM openings therefor. The following description applies to the pixel patterns of all colors of red, green and blue. FIG. 7 includes four sets of a pixel, an anode electrode, and an FMM opening, by way of example. In relation to the pixel 251J, the pixel 251K is an adjacent pixel of the same color in a pixel row adjacent to the row including the pixel 251J. The pixel 251K is a pixel of the same color as the pixel 251J and closest to the pixel 251J in a pixel row adjacent to the row including the pixel 251J.

The pixel 251J has four adjacent pixels of the same color in the pixel rows adjacent to the row including the pixel 251J. One of the four pixels is the pixel 251K; the relation between the pixel 251J and the pixel 251K described in the following applies to the relations between the pixel 251J and the three other pixels.

The distance between the pixel 251J and the pixel 251K is the distance between their centroids. The pixel 251J has a side 611J facing the pixel 251K. The pixel 251K has a side 611K facing the pixel 251J. The side 611J of the pixel 251J and the side 611K of the pixel 251K opposed to each other intersect with the line (the centroid connecting line) connecting the centroid of the pixel 251J and the centroid of the pixel 251K.

The distance between the perimeter of the pixel 251J and the perimeter of the pixel 251K is the distance between the sides 611J and 611K opposed to each other. In FIG. 7, the distance between the sides 611J and 611K opposed to each other is denoted by B1. FIG. 7 indicates the distance B1 between the pixel 251L and the pixel 251M for convenience of illustration. The relation between the pixel 251L and the pixel 251M is the same as the relation between the pixel 251J and the pixel 251K.

The line (the centroid connecting line) connecting the centroid of the pixel 251J and the centroid of the pixel 251K intersects perpendicularly (at 90.0 degrees) with the sides 611J and 611K opposed to each other. Accordingly, the distance between the point where the centroid connecting line intersects with the side 611J and the point where the centroid connecting line intersects with the side 611K is the distance B1 between the sides 611J and 611K.

The distance in the row direction (X-axis direction) between the centroid of the pixel 251J and the centroid of the pixel 251K is 1.5Px. The distance in the column direction (Y-axis direction) between the centroid of the pixel 251J and the centroid of the pixel 251K is Py. As described above, the ratio of Px to Py in the real resolution is 4 to 3. The angle between the side 611J and the line (centroid connecting line) connecting the centroid of the pixel 251J and the centroid of the pixel 251K is 90.0 degrees. Accordingly, the angle θ1 between the side 611K and the row direction (the X-axis) is 63.4 degrees. The angle between the side 611J and the row direction (the X-axis) is also θ1=63.4 degrees.

The same explanation applies to the relation between the anode electrodes 162J and 162K and the relation between the FMM openings 541J and 541K. Specific description is provided about the FMM openings 541J and 541K. The FMM opening 541K is an FMM opening adjacent to the FMM opening 541J in a row adjacent to the row including the FMM opening 541J. The FMM opening 541K is an FMM opening closest to the FMM opening 541J in a row adjacent to the row including the FMM opening 541J.

The FMM opening 541J has four adjacent FMM openings in the pixel rows adjacent to the row including the FMM opening 541J. One of the four FMM openings is the FMM opening 541K; the relation between the FMM opening 541J and the FMM opening 541K described in the following applies to the relations between the FMM opening 541J and the three other FMM openings.

The distance between the FMM opening 541J and the FMM opening 541K is the distance between their centroids. The FMM opening 541J has a side 613J facing the FMM opening 541K. The FMM opening 541K has a side 613K facing the FMM opening 541J. The side 613J of the FMM opening 541J and the side 613K of the FMM opening 541K opposed to each other intersect with the line (the centroid connecting line) connecting the centroid of the FMM opening 541J and the centroid of the FMM opening 541K.

The distance between the perimeter of the FMM opening 541J and the perimeter of the FMM opening 541K is the distance between the sides 613J and 613K opposed to each other. In FIG. 7, the distance between the sides 613J and 613K opposed to each other is denoted by B2. FIG. 7 indicates the distance B2 between the FMM opening 541L and the FMM opening 541M for convenience of illustration. The relation between the FMM opening 541L and the FMM opening 541M is the same as the relation between the FMM opening 541J and the FMM opening 541K.

The line (the centroid connecting line) connecting the centroid of the FMM opening 541J and the centroid of the FMM opening 541K intersects perpendicularly (at 90.0 degrees) with the sides 613J and 613K opposed to each other. Accordingly, the distance between the point where the centroid connecting line intersects with the side 613J and the point where the centroid connecting line intersects with the side 613K is the distance B2 between the sides 613J and 613K.

The distance in the row direction (X-axis direction) between the centroid of the FMM opening 541J and the centroid of the FMM opening 541K is 1.5 Px. The distance in the column direction (Y-axis direction) between the centroid of the FMM opening 541J and the centroid of the FMM opening 541K is Py. The angle between the side 613J and the line (centroid connecting line) connecting the centroid of the FMM opening 541J and the centroid of the FMM opening 541K is 90.0 degrees. Accordingly, the angle θ2 between the side 613K and the row direction (the X-axis) is 63.4 degrees. The angle between the side 613J and the row direction (the X-axis) is also θ2=63.4 degrees.

Next, the relation between the pixel 251J and the pixel 251L is described. In relation to the pixel 251J, the pixel 251L is an adjacent pixel of the same color in the column direction. The pixel 251L is a pixel of the same color as the pixel 251J and closest to the pixel 251J in the pixel row located at two rows away from the pixel row including the pixel 251J. The pixel 251J has two adjacent pixels of the same color in the column direction. One of the two pixels is the pixel 251L; the relation between the pixel 251J and the pixel 251L described in the following applies to the relation between the pixel 251J and the other pixel.

The distance between the pixel 251J and the pixel 251L is the distance between their centroids. The pixel 251J has a side 615J facing the pixel 251L. The pixel 251L has a side 615L facing the pixel 251J. The side 615J of the pixel 251J and the side 615L of the pixel 251L opposed to each other intersect with the line (centroid connecting line) connecting the centroid of the pixel 251J and the centroid of the pixel 251L. The sides 615J and 615L are parallel to the row direction (the X-axis).

The distance between the perimeter of the pixel 251J and the perimeter of the pixel 251L is the distance between the sides 615J and 615L opposed to each other. In FIG. 7, the distance between the sides 615J and 615L opposed to each other is denoted by C1. The line (centroid connecting line) connecting the centroid of the pixel 251J and the centroid of the pixel 251L is parallel to the column direction (the Y-axis). Accordingly, the centroid connecting line intersects perpendicularly (at 90.0 degrees) with the sides 615J and 615L opposed to each other. The distance between the point where the centroid connecting line intersects with the side 615J and the point where the centroid connecting line intersects with the side 615L is the distance C1 between the sides 615J and 615L.

The same explanation applies to the relation between the anode electrodes 162J and 162L and the relation between the FMM openings 541J and 541L. Specific description is provided about the FMM openings 541J and 541L. The FMM opening 541L is an FMM opening adjacent to the FMM opening 541J in the column direction. The FMM opening 541L is an FMM opening closest to the FMM opening 541J in the row located two rows away from the row including the FMM opening 541J. The FMM opening 541J has two adjacent FMM openings in the column direction. One of the two FMM openings is the FMM opening 541L; the relation between the FMM opening 541J and the FMM opening 541L described in the following applies to the relation between the FMM opening 541J and the other FMM opening.

The distance between the FMM opening 541J and the FMM opening 541L is the distance between their centroids. The FMM opening 541J has a side 617J facing the FMM opening 541K. The FMM opening 541L has a side 617L facing the FMM opening 541J. The side 617J of the FMM opening 541J and the side 617L of the FMM opening 541L opposed to each other intersect with the line (the centroid connecting line) connecting the centroid of the FMM opening 541J and the centroid of the FMM opening 541L. The sides 617J and 617L are parallel to the row direction (the X-axis).

The distance between the perimeter of the FMM opening 541J and the perimeter of the FMM opening 541L is the distance between the sides 617J and 617L opposed to each other. In FIG. 7, the distance between the sides 617J and 617L opposed to each other is denoted by C2. The line (centroid connecting line) connecting the centroid of the FMM opening 541J and the centroid of the FMM opening 541L is parallel to the column direction (the Y-axis). Accordingly, the centroid connecting line intersects perpendicularly (at 90.0 degrees) with the sides 617J and 617L opposed to each other. The distance between the point where the centroid connecting line intersects with the side 617J and the point where the centroid connecting line interests with the side 617L is the distance C2 between the sides 617J and 617L.

As a nature of human eyes, when polygonal (inclusive of circular) pixels emitting three primary colors of light are closely adjacent to one another, human eyes recognize the pixels as one pixel of full color where the three primary colors of the adjacent pixels are mixed. To attain the ideal mixture of three colors (to attain a natural image in which the pixels are indistinctive), it is preferable that the distribution of the pixels (light emitting regions) of the same color be symmetric about the centroid of each pixel and each pixel have a larger area. Accordingly, it is important that the shape of a pixel be symmetric about a given line passing through the centroid and the distance from the centroid to the end of the pixel be long.

Meanwhile, for highly precise vapor deposition of an organic light-emitting material with an FMM, deformation of the FMM in the vapor deposition needs to be minimum. To achieve small deformation of the FMM, it is important that the bridge width of the FMM be wide. The bridge width is a distance between peripheries of FMM openings adjacent to each other. In the example of FIG. 7, the distance B2 is a bridge width in an oblique direction and the distance C2 is a bridge width in the column direction (Y-axis direction). The oblique direction is an intermediate direction between the row direction (X-axis direction) and the column direction (Y-axis direction).

When the opposed sides of pixels of the same color adjacent to each other are perpendiculars to the line connecting the centroids of these pixels and further, the opposed sides of FMM openings adjacent to each other are perpendiculars to the line connecting the centroids of these FMM openings, the distance from the centroid of a pixel to the end (perimeter) of the pixel can be maximized while attaining a desired bridge width.

Among the pixels of the same color in the pixel layout of delta-nabla arrangement, pixels close to a given pixel are two pixels adjacent in the column direction and four pixels adjacent in the oblique directions out of the pixels adjacent to the given pixel, as illustrated in FIG. 7. In the example of FIG. 7, the pixel 251L is a pixel adjacent to the pixel 251J in the column direction and the pixels 251K and 251M are pixels adjacent to the pixel 251J in the oblique directions. The distance between pixels adjacent to each other in the row direction is longer than the distance between pixels adjacent to each other in the column direction or the distance between pixels adjacent to each other in an oblique direction.

Accordingly, to achieve a larger pixel area while satisfying the foregoing conditions in the pixel arrangement in FIG. 7, the shape of each pixel is to be a hexagon or an octagon and the sides facing the pixels of the same color adjacent in the column direction and the oblique directions are to be perpendicular to the centroid connecting lines between the pixel and the adjacent pixels of the same color. The octagonal pixel shown in FIG. 7 satisfies these conditions. The hexagonal pixel that satisfies the foregoing conditions has two corners on the line passing through its centroid and extending in the row direction.

In similar, the shape of each FMM opening that satisfies the foregoing conditions is a hexagon or an octagon and the sides facing the FMM openings adjacent in the column direction and the oblique directions are perpendicular to the centroid connecting lines between the FMM opening and the adjacent FMM openings. The octagonal FMM opening shown in FIG. 7 satisfies these conditions. The hexagonal FMM opening that satisfies the foregoing conditions has two corners on the line passing through its centroid and extending in the row direction.

As described above, the shape and the layout of the pixels and the shape and the layout of the FMM openings described with reference to FIG. 7 achieve a shape of pixel that is large and symmetric about the centroid and a wider bridge width.

Figure 8:
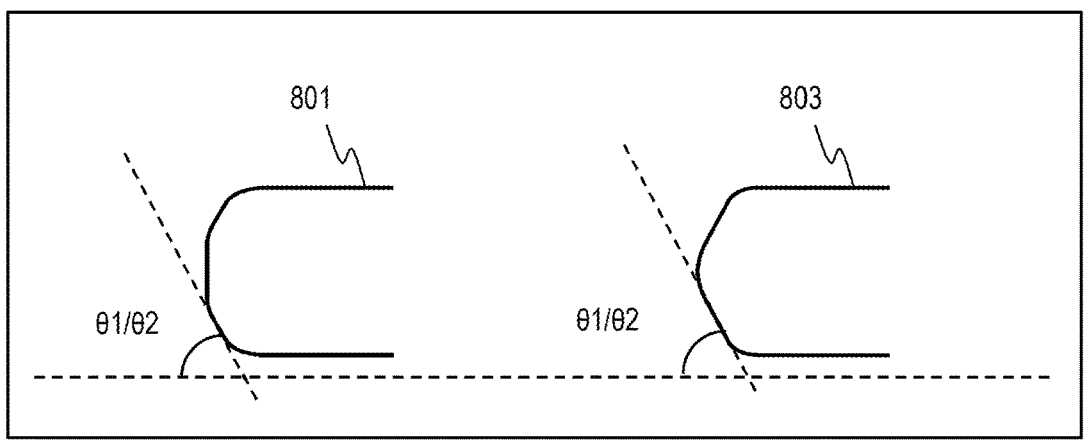
FIG. 8 provides examples of the shape of a pixel or an FMM opening.

FIG. 8 provides examples of the shape of a pixel or an FMM opening. The shape 801 is an octagon having curved corners. The shape 803 is a hexagon having round corners. The shape of a pixel or an FMM opening can be a hexagon or an octagon having round corners like these examples. The same explanation is applicable to the shape of an anode electrode 162.

Pixel Control

Figure 9:
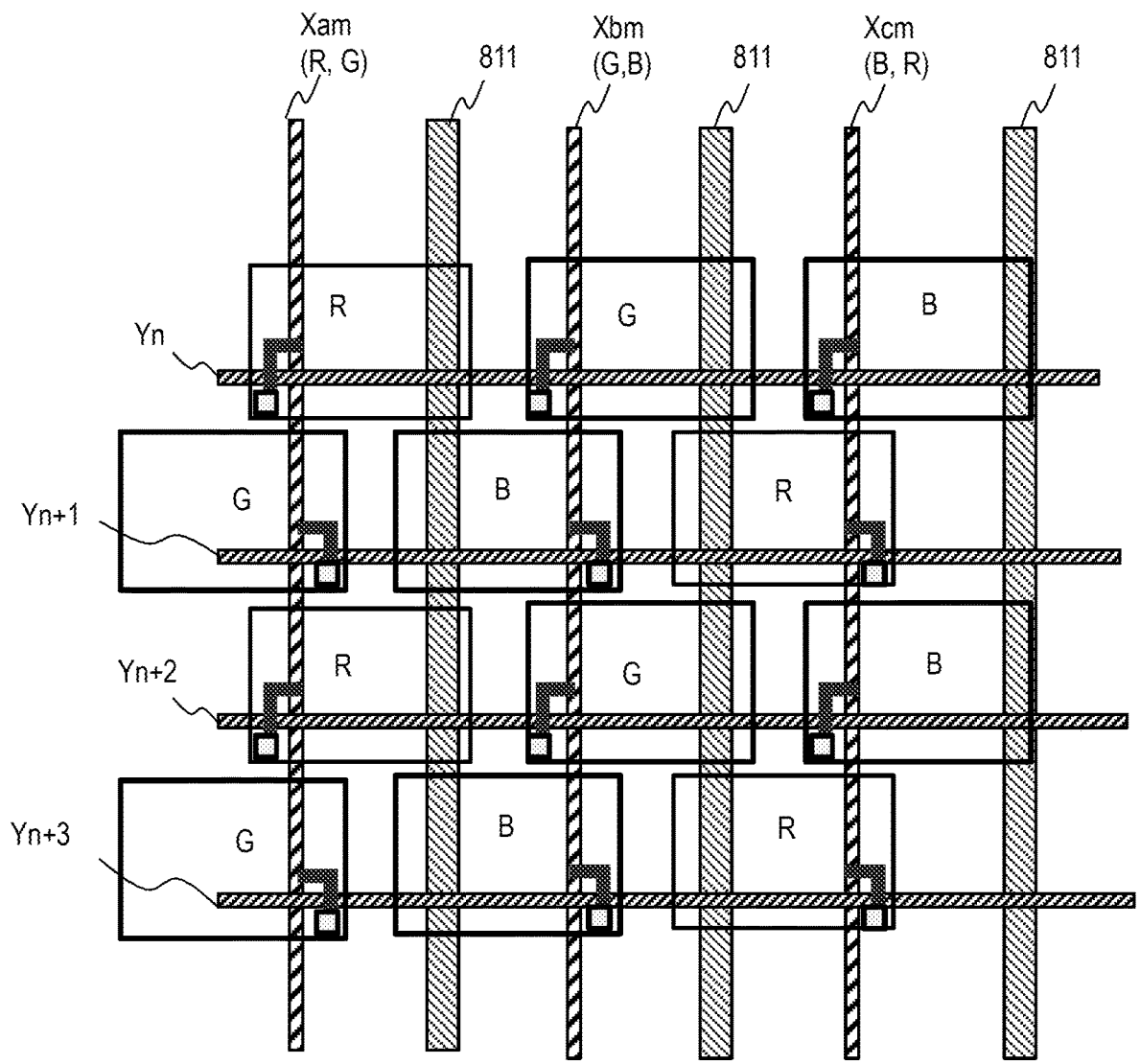
FIG. 9 schematically illustrates an example of a layout of pixels (anode electrodes thereof) and lines and an example of connection of the pixels (anode electrodes thereof) and the lines in the same pixel layout as the one in FIG. 4.

FIG. 9 schematically illustrates an example of a layout of pixels (anode electrodes thereof) and lines and an example of connection of the pixels (anode electrodes thereof) and the lines in the same pixel layout as the one in FIG. 4. FIG. 9 is to provide an example; any other connection is applicable to this pixel layout.

FIG. 9 includes twelve pixels, three data lines Xam, Xbm, Xcm, four scanning lines Yn, Yn+1, Yn+2, Yn+3, and three power lines 811. The remaining of the display region 125 has the same configuration as the one in FIG. 9.

The scanning lines Yn, Yn+1, Yn+2, and Yn+3 are connected with n-th pixel row, (n+1)th pixel row, (n+2)th pixel row, and (n+3)th pixel row, respectively. The scanning lines Yn, Yn+1, Yn+2, and Yn+3 supply scanning signals to the connected pixel rows one after another. In response to the scanning signal supplied from a scanning line, all pixels in the connected pixel row are selected.

The data line Xam is connected with a pixel column in which R pixels and G pixels are disposed alternately. The data line Xbm is connected with a pixel column in which G pixels and B pixels are disposed alternately. The data line Xcm is connected with a pixel column in which B pixels and R pixels are disposed alternately. The data line Xam repeats output to an R pixel and output to a G pixel alternately. The data line Xbm repeats output to a G pixel and output to a B pixel alternately. The data line Xcm repeats output to a B pixel and output to an R pixel alternately.

The data lines Xam, Xbm, Xcm are disposed alternately with the power lines 811. In the example of FIG. 9, each power line 811 supplies power to pixels through driving transistors each connected with one adjacent data line (for example, the data line on the left). The same connection of the data lines Xam, Xbm, and Xcm with pixels is repeated in the remaining of the display region 125.

Figure 10:
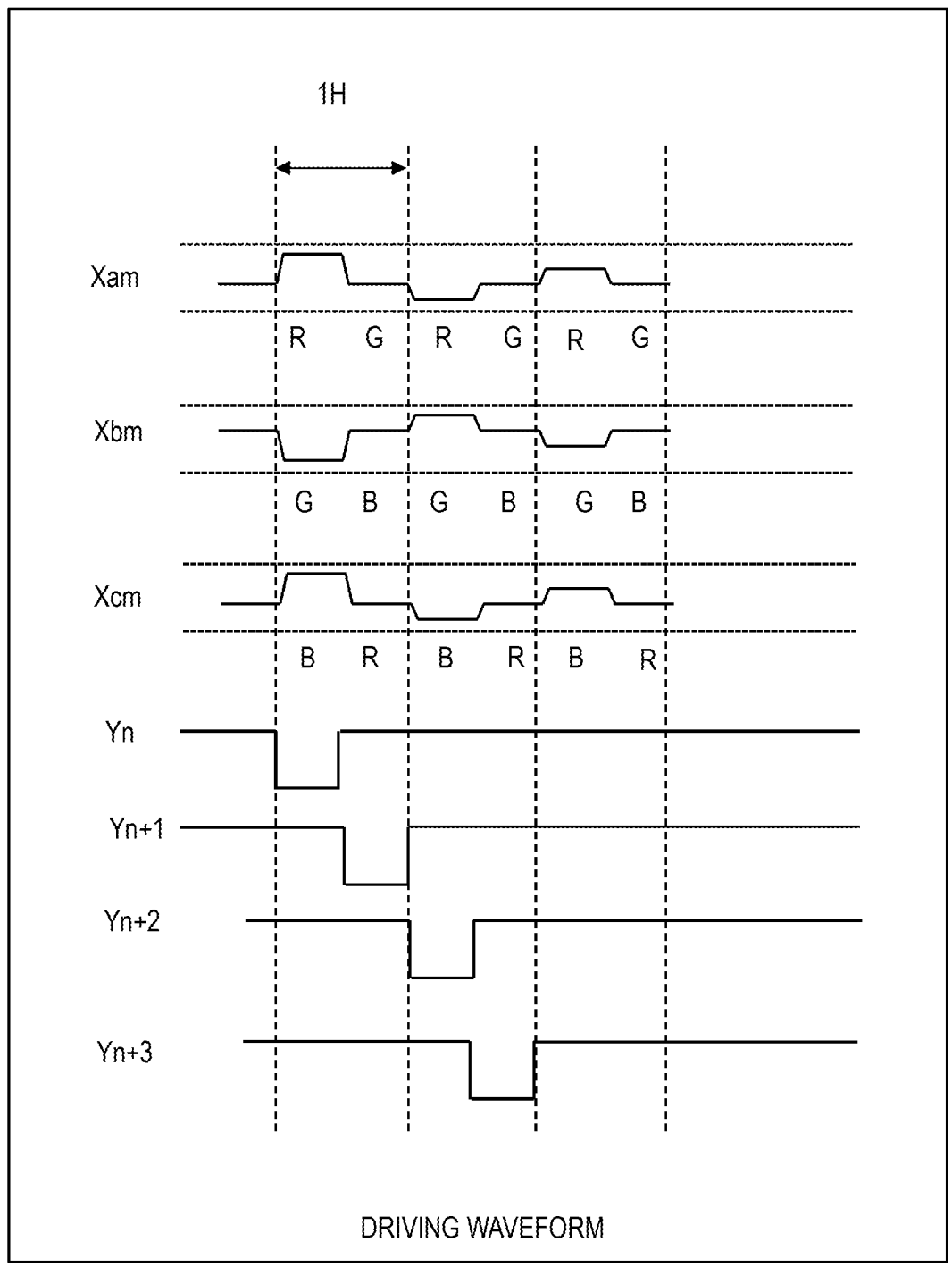
FIG. 10 is a timing chart for driving the pixels in the pixel layout in FIG. 9.

FIG. 10 is a timing chart for driving the pixels in the pixel layout in FIG. 9. FIG. 10 provides waveforms of data signals (hereinafter, referred to as signals) from the data lines Xam, Xbm, and Xcm and waveforms of selection pulses from the scanning lines Yn, Yn+1, Yn+2, and Yn+3. The scanning lines Yn, Yn+1, Yn+2, and Yn+3 output selection pulses in turn at different times. The selection pulses for the scanning lines Yn, Yn+1, Yn+2, and Yn+3 are output by a scanning driver circuit 131. The data signals for the data lines Xam, Xbm, and Xcm are output by a driver IC 134.

When the scanning line Yn is outputting a selection pulse, the data line Xam outputs a signal to the R pixel in the n-th pixel row. When the scanning line Yn is outputting a selection pulse, the data line Xbm outputs a signal to the G pixel in the n-th pixel row. When the scanning line Yn is outputting a selection pulse, the data line Xcm outputs a signal to the B pixel in the n-th pixel row.

When the scanning line Yn+1 is outputting a selection pulse, the data line Xam outputs a signal to the G pixel in the (n+1)th pixel row. When the scanning line Yn+1 is outputting a selection pulse, the data line Xbm outputs a signal to the B pixel in the (n+1)th pixel row. When the scanning line Yn+1 is outputting a selection pulse, the data line Xcm outputs a signal to the R pixel in the (n+1)th pixel row.

When the scanning line Yn+2 is outputting a selection pulse, the data line Xam outputs a signal to the R pixel in the (n+2)th pixel row. When the scanning line Yn+2 is outputting a selection pulse, the data line Xbm outputs a signal to the G pixel in the (n+2)th pixel row. When the scanning line Yn+2 is outputting a selection pulse, the data line Xcm outputs a signal to the B pixel in the (n+2)th pixel row.

When the scanning line Yn+3 is outputting a selection pulse, the data line Xam outputs a signal to the G pixel in the (n+3)th pixel row. When the scanning line Yn+3 is outputting a selection pulse, the data line Xbm outputs a signal to the B pixel in the (n+3)th pixel row. When the scanning line Yn+3 is outputting a selection pulse, the data line Xcm outputs a signal to the R pixel in the (n+3)th pixel row.

The scanning lines Yn and Yn+1 successively output selection pulses within one horizontal period (1H). The scanning lines Yn+2 and Yn+3 successively output selection pulses within the next horizontal period (1H). The widths of the selection pulses are the same; each of the scanning lines Yn, Yn+1, Yn+2, and Yn+3 outputs a selection pulse in substantially ½ of a horizontal period.

FMM Opening Layout

Figure 11:
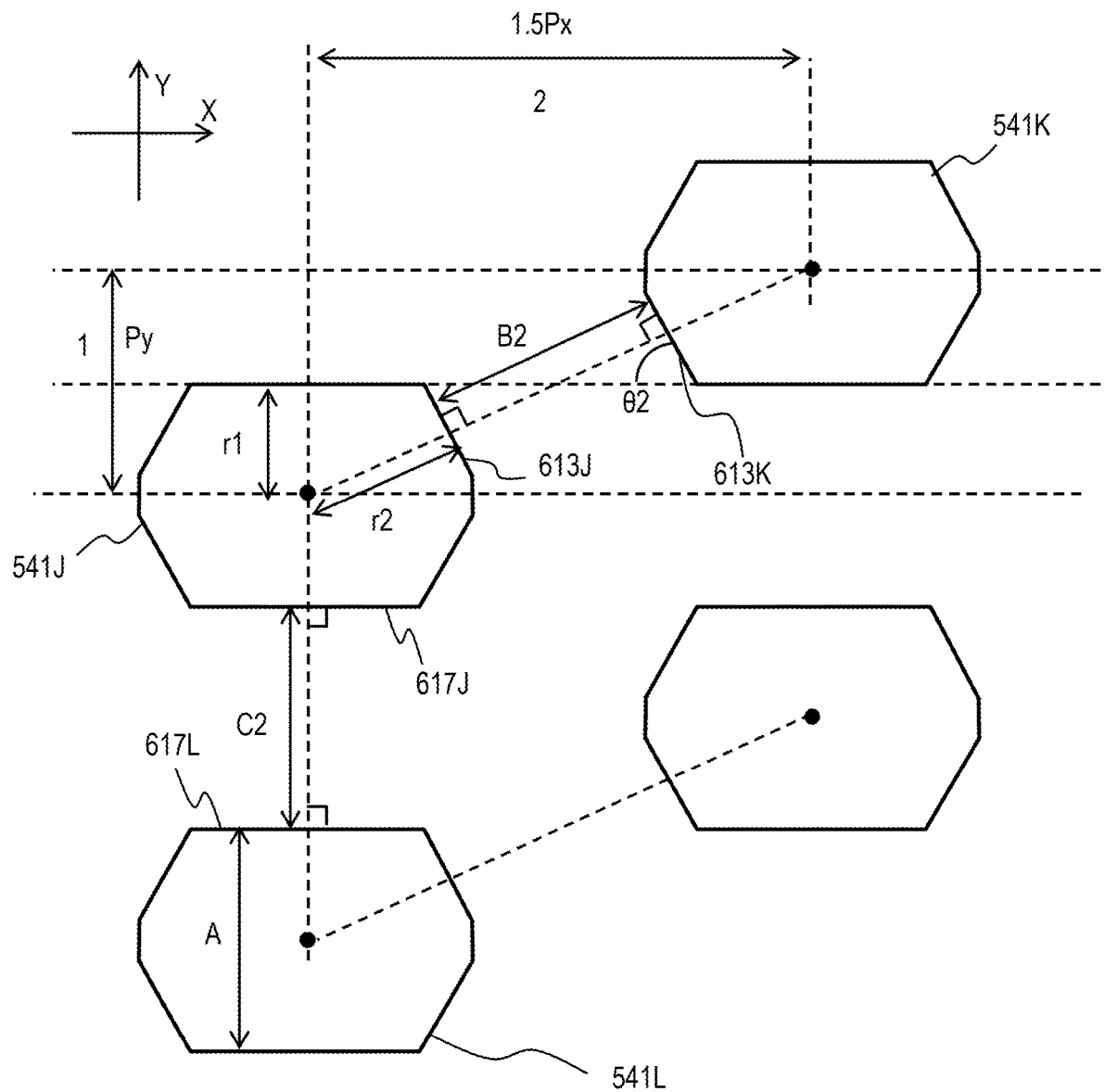
FIG. 11 illustrates an FMM opening layout of an FMM for one of the colors of red, green, and blue.

Hereinafter, the relation between the opening width and the bridge width in an FMM is described. FIG. 11 illustrates an FMM opening layout of an FMM for one of the colors of red, green and blue. The following description applies to the FMMs for all colors of red, green, and blue. The description provided with reference to FIG. 7 applies to FIG. 11.

The width in the column direction of an FMM opening is expressed as 2r1. The width in an oblique direction of an FMM opening is expressed as 2r2. The oblique direction is the direction connecting the centroid of an FMM opening to the centroid of an adjacent FMM opening in a row adjacent to the row including the FMM opening.

To achieve small deformation of the FMM, it is preferable that the bridge width B2 be equal to or wider than the narrowest width A of an FMM opening. Furthermore, it is preferable that the bridge width C2 be equal to or wider than the narrowest width A. In the example of FIG. 11, the narrowest width A of an FMM opening is 2r1. In the vapor deposition step in this embodiment, the FMM is positioned in the state where the FMM is pulled in the row direction. The relation between the bridge width B2 including components of the direction of pull and the narrowest width A of an FMM opening is more important.

In the FMM opening layout in FIG. 11, the bridge width C2 in the column direction is (2Py−2r1), where Py is an FMM opening pitch (pixel pitch) in the column direction. The bridge width B2 in the oblique direction is (Py√5−2r2).

To prevent deformation of the FMM, it is preferable to satisfy the following condition:

Bridge width $B2=(Py\sqrt{5}-2r2) \geq$ Narrowest width $A$ of FMM opening$=2r1$.

To prevent deformation of the FMM, it is preferable to further satisfy the following condition:

Bridge width $C2=(2Py-2r1) \geq$ Narrowest width $A$ of FMM opening$=2r1$.

Figure 12:
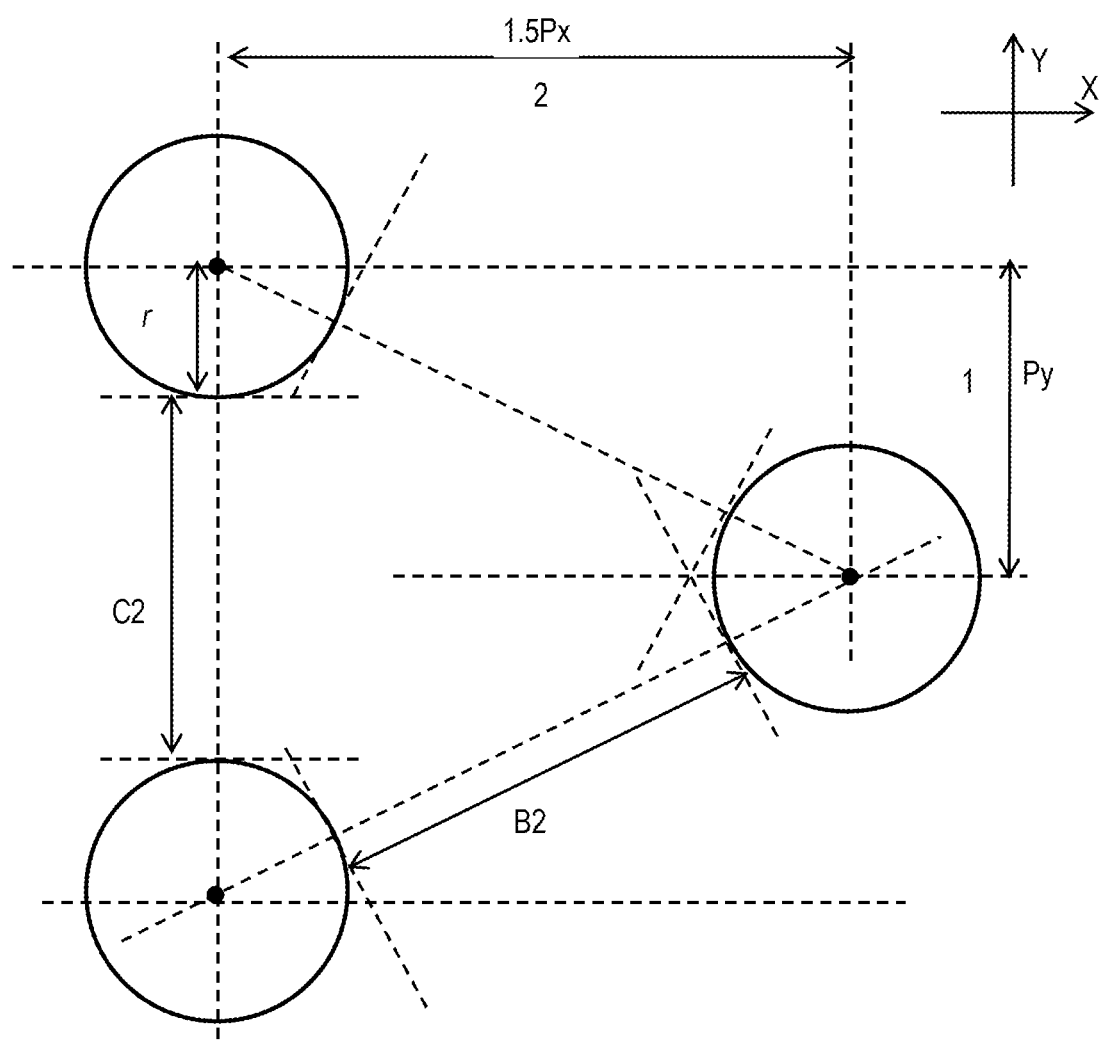
FIG. 12 illustrates another example of an FMM opening layout of an FMM for one of the colors of red, green, and blue.

FIG. 12 illustrates another example of an FMM opening layout of an FMM for one of the colors of red, green, and blue. The following description applies to the FMMs for all colors of red, green, and blue. Each FMM opening is a true circle. The disposition of the centroids of the FMM openings (centers of the true circles) is the same as that in the layout in FIG. 11.

The radius of a circular FMM opening is expressed as r. As described with reference to FIG. 11, to prevent deformation of the FMM, it is preferable to satisfy the following condition:

Bridge width $B2=(Py\sqrt{5}-2r) \geq$ Narrowest width $A$ of FMM opening$=2r$.

To prevent deformation of the FMM, it is preferable to further satisfy the following condition:

Bridge width $C2=(2Py-2r) \geq$ Narrowest width $A$ of FMM opening$=2r$.

The foregoing description is applicable to the layout of the pixels of the same color and the layout of the anode electrodes of the pixels of the same color. As described above, the disposition of the centroids of the pixels of the same color is the same as the disposition of the centroids of the FMM openings and the shape of the pixels is smaller than and similar to the shape of the FMM openings. Accordingly, it is preferable that the distance B1 between the perimeters of the pixels of the same color adjacent to each other in an oblique direction or the distance C1 between the perimeters of the pixels of the same color adjacent to each other in the column direction be equal to or longer than the narrowest pixel width. The same applies to the anode electrodes.

Another Layout of Pixels and FMM Openings

Figure 13:
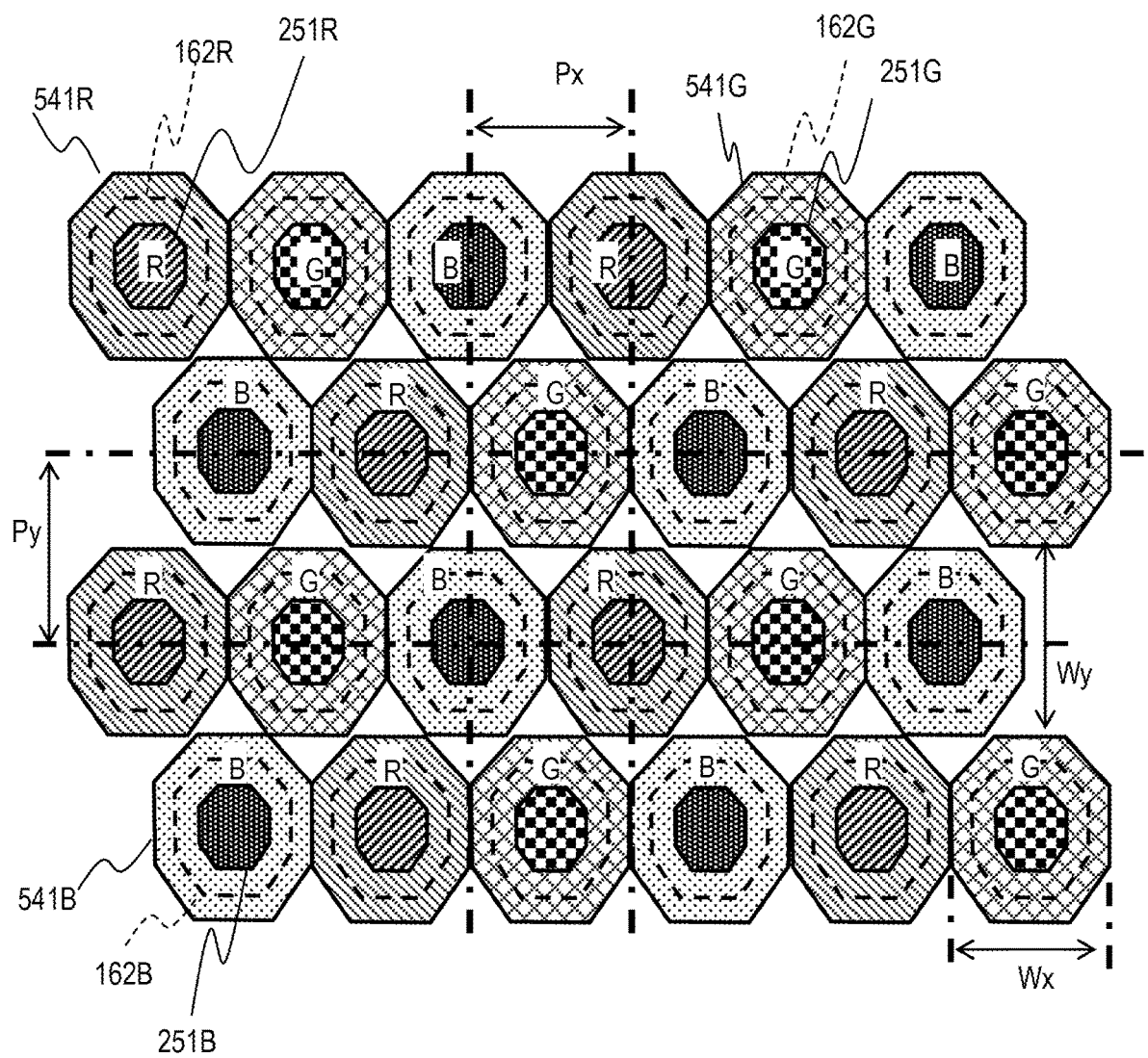
FIG. 13 illustrates a pixel layout of delta-nabla arrangement for displaying an image by rendering.

FIG. 13 illustrates a pixel layout of delta-nabla arrangement for displaying an image by rendering, specifically, a pixel layout for delta-nabla vertical direction ⅔ pixel rendering. The number of pixel columns (data lines) is the same as that in the pixel layout for the real resolution and the number of pixel rows (scanning lines) is ⅔ of that in the pixel layout for the real resolution. This configuration facilitates designing the TFT circuit. This configuration allows reduction in number of output pins of the scanning driver 131 and the emission driver 132; accordingly, the TFT circuit can be designed easily and the area occupied by the drivers is reduced.

Like FIG. 4, FIG. 13 illustrates a layout of pixels, anode electrodes, and FMM openings of three FMMs. In the following, differences from the delta-nabla arrangement for the real resolution described with reference to FIGS. 4 to 6 are mainly described.

Compared to the layout for the real resolution in FIG. 4, this layout is different in the ratio of the pixel pitch Px in the row direction to the pixel pitch Py in the column direction. Furthermore, the aspect ratios of the pixels, the anode electrodes, and the FMM openings are different. The vertical direction corresponds to the column direction and the horizontal direction corresponds to the row direction.

Figure 14:
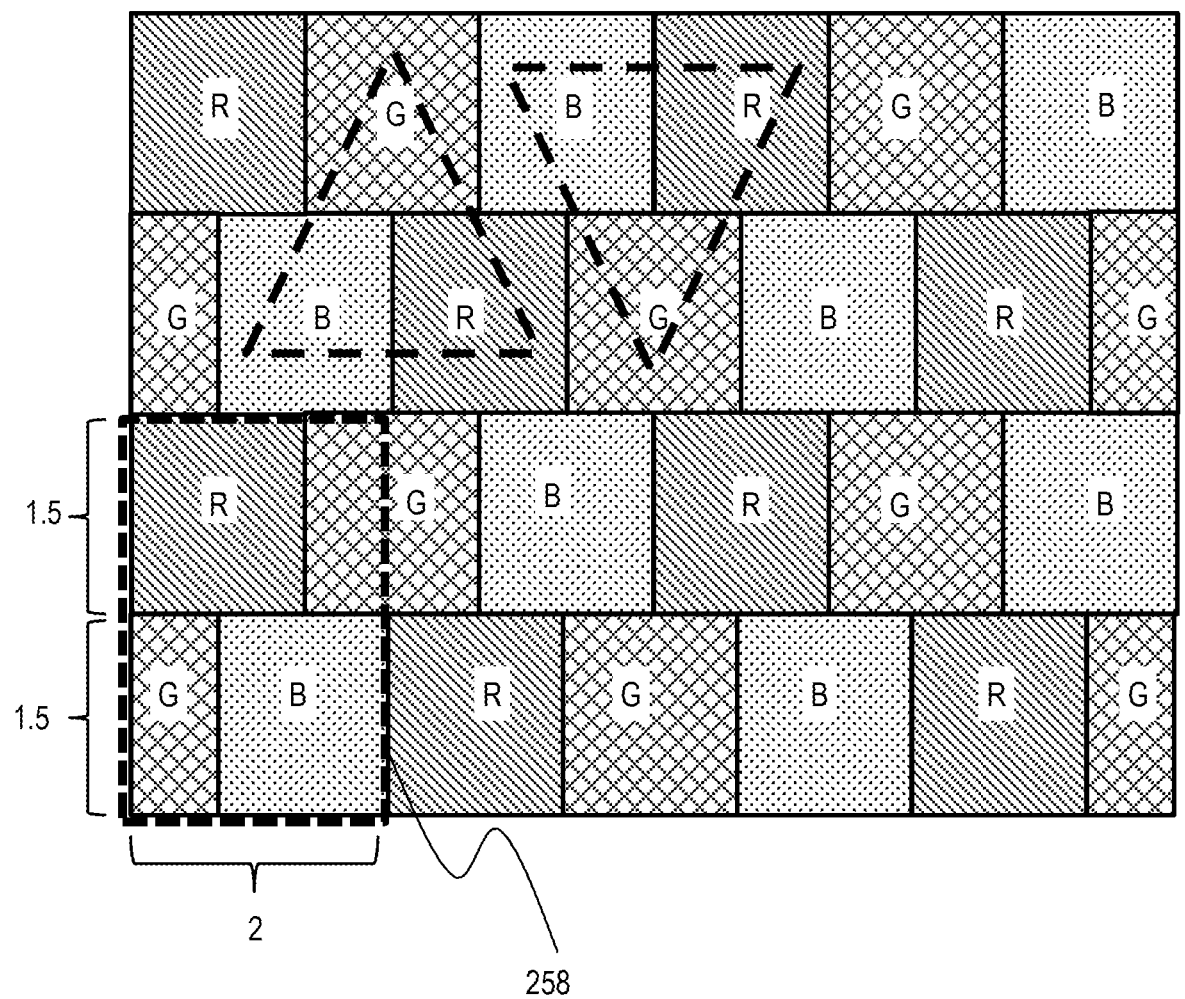
FIG. 14 illustrates a color pattern of the pixels for delta-nabla vertical direction ⅔ pixel rendering.

FIG. 14 illustrates a color pattern of the pixels for the delta-nabla vertical direction ⅔ pixel rendering. As indicated by the rectangle 258 surrounded by a dashed line, the colors of R, G, and B are balanced in a rectangle having an aspect ratio of 3 to 2. The definition of a display pixel for rendering is ambiguous, unlike the display pixel for the real resolution.

The ratio of the pixel pitch Px in the row direction to the pixel pitch Py in the column direction is 8 to 9. Like the pixel layout for the real resolution, the length Wx in the row direction of an FMM opening is equal to the pixel pitch Px in the row direction. Furthermore, the length Wy in the column direction of an FMM opening is equal to the pixel pitch Py in the column direction.

Figure 15:
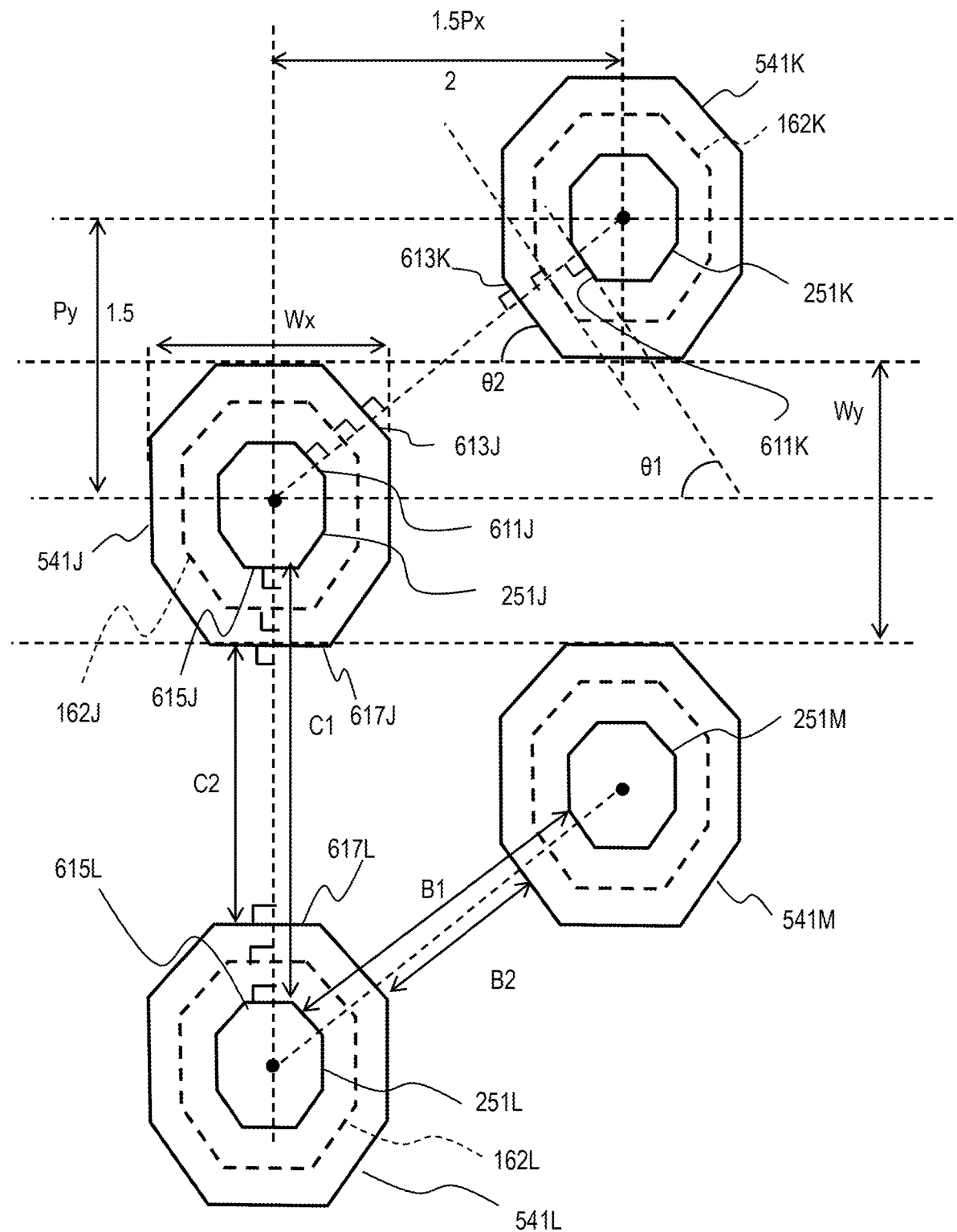
FIG. 15 illustrates a layout of pixels of one of the colors of red, green, and blue, anode electrodes thereof, and FMM openings therefor for the delta-nabla vertical direction ⅔ pixel rendering.

FIG. 15 illustrates a layout of pixels of one of the colors of red, green, and blue, anode electrodes thereof, and FMM openings therefor for the delta-nabla vertical direction ⅔ pixel rendering. The following description applies to the pixel patterns of all colors of red, green and blue. In the following, differences from the layout for the real resolution described with reference to FIG. 7 are mainly described.

Like the layout for the real resolution, the line (the centroid connecting line) connecting the centroid of the pixel 251J and the centroid of the pixel 251K intersects perpendicularly (at 90.0 degrees) with the sides 611J and 611K opposed to each other. As described above, the ratio of the pixel pitch Px in the row direction to the pixel pitch Py in the column direction is 8 to 9, unlike the layout for the real resolution. Accordingly, the angle θ1 between the side 611K and the row direction (the X-axis) is 53.1 degrees. The angle between the side 611J and the row direction (the X-axis) is also θ1=53.1 degrees.

Like the layout for the real resolution, the line (the centroid connecting line) connecting the centroid of the FMM opening 541J and the centroid of the FMM opening 541K intersects perpendicularly (at 90.0 degrees) with the sides 613J and 613K opposed to each other.

The distance in the row direction (X-axis direction) between the centroid of the FMM opening 541J and the centroid of the FMM opening 541K is 1.5Px. The distance in the column direction (Y-axis direction) between the centroid of the FMM opening 541J and the centroid of the FMM opening 541K is Py.

Furthermore, the angle between the side 613J and the line (centroid connecting line) connecting the centroid of the FMM opening 541J and the centroid of the FMM opening 541K is 90.0 degrees. Accordingly, the angle θ2 between the side 613K and the row direction (the X-axis) is 53.1 degrees. The angle between the side 613J and the row direction (the X-axis) is also θ2=53.1 degrees.

The description provided with reference to FIG. 11 or 12 is applicable to the FMM opening layout for the delta-nabla vertical direction ⅔ pixel rendering. In the FMM opening layout for the delta-nabla vertical direction ⅔ pixel rendering, the bridge width C2 in the column direction is (2Py−2r1). The bridge width B2 in the oblique direction is (5Py/3−2r2). As illustrated in FIG. 15, in a right triangle having the hypotenuse of the centroid connecting line between two pixels, the relation among the base, the short side (height), and the hypotenuse is 4 (indicated as 2 in FIG. 15): 3 (indicated as 1.5 in FIG. 15): 5 and a half of the width of an opening in the direction along the centroid connecting line is r2 (see FIG. 11); accordingly the bridge width B2 in the oblique direction can be expressed as above.

Accordingly, to prevent deformation of the FMM, it is preferable that the layout of hexagonal or octagonal FMM openings satisfy the following condition;

Bridge width $B2=(5Py/3-2r2) \geq$ Narrowest width $A$ of FMM opening=$2r1$.

To prevent deformation of the FMM, it is preferable to further satisfy the following condition:

Bridge width $C2=(2Py-2r1) \geq$ Narrowest width $A$ of FMM opening=$2r1$.

As to the layout of true circular FMM openings, it is preferable to satisfy the following condition:

Bridge width $B2=(5Py/3-2r) \geq$ Narrowest width $A$ of FMM opening=$2r$.

To prevent the deformation of the FMM, it is preferable to further satisfy the following condition:

Bridge width $C2=(2Py-2r) \geq$ Narrowest width $A$ of FMM opening=$2r$.

The foregoing description is applicable to the layout of the pixels of the same color and the layout of the anode electrodes of the pixels of the same color. As described above, the disposition of the centroids of the pixels of the same color is the same as the disposition of the centroids of the FMM openings and the shape of the pixels is smaller than and similar to the shape of the FMM openings. Accordingly, it is preferable that the distance B1 between the perimeters of the pixels of the same color adjacent to each other in an oblique direction or the distance C1 between the perimeters of the pixels of the same color adjacent to each other in the column direction be equal to or longer than the narrowest pixel width. The same applies to the anode electrodes.

Still Another Layout of Pixels and FMM Openings

Figure 16:
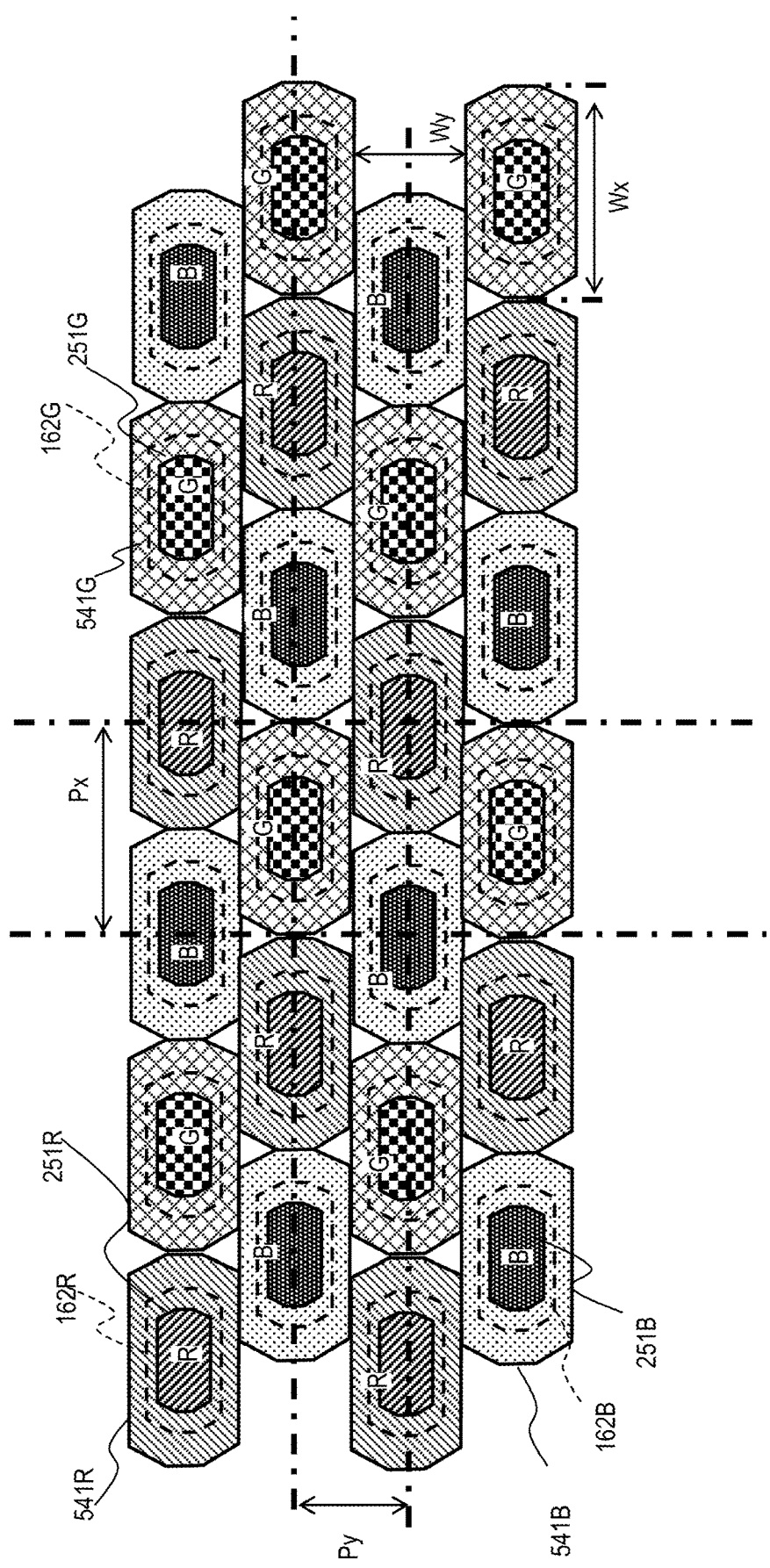
FIG. 16 illustrates another pixel layout of delta-nabla arrangement for displaying an image by rendering.

FIG. 16 illustrates another pixel layout of delta-nabla arrangement for displaying an image by rendering, specifically, a pixel layout for delta-nabla horizontal direction ⅔ pixel rendering. The number of pixel rows (scanning lines) is the same as that in the pixel layout for the real resolution and the number of pixel columns (data lines) is ⅔ of that in the pixel layout for the real resolution. This configuration allows reduction in number of output pins of the data driver IC.

Like FIG. 4, FIG. 16 illustrates a layout of pixels, anode electrodes, and FMM openings of three FMMs. In the following, differences from the delta-nabla arrangement for the real resolution described with reference to FIGS. 4 to 6 are mainly described.

Compared to the layout for the real resolution in FIG. 4, this layout is different in the ratio of the pixel pitch Px in the row direction to the pixel pitch Py in the column direction. Furthermore, the aspect ratios of the pixels, the anode electrodes, and the FMM openings are different. The vertical direction corresponds to the column direction and the horizontal direction corresponds to the row direction.

Figure 17:
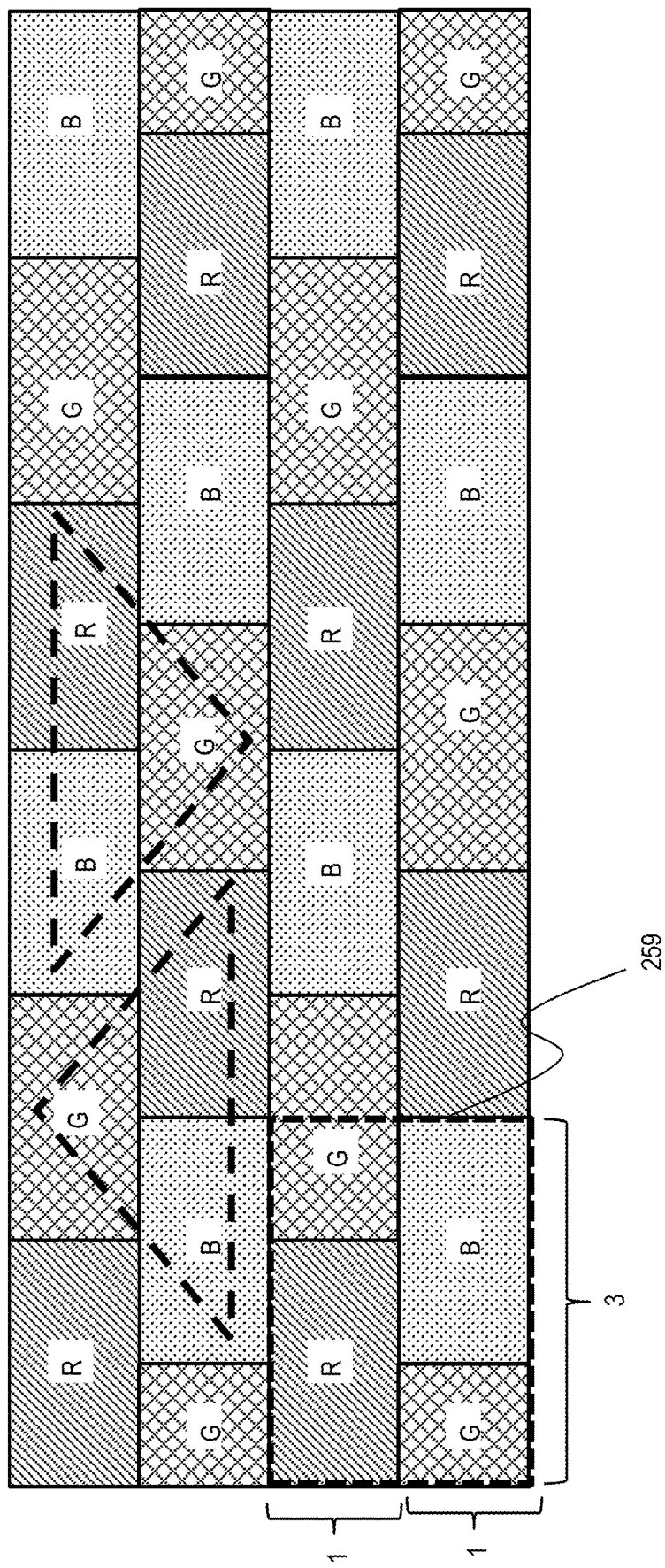
FIG. 17 illustrates a color pattern of the pixels for delta-nabla horizontal direction ⅔ pixel rendering.

FIG. 17 illustrates a color pattern of the pixels for the delta-nabla horizontal direction ⅔ pixel rendering. As indicated by the rectangle 259 surrounded by a dashed line, the colors of R, G, and B are balanced in a rectangle having an aspect ratio of 2 to 3. The definition of a display pixel for rendering is ambiguous, unlike the display pixel for the real resolution.

The ratio of the pixel pitch Px in the row direction to the pixel pitch Py in the column direction is 2 to 1. Like the pixel layout for the real resolution, the length Wx in the row direction of an FMM opening is equal to the pixel pitch Px in the row direction. Furthermore, the length Wy in the column direction of an FMM opening is equal to the pixel pitch Py in the column direction.

Figure 18:
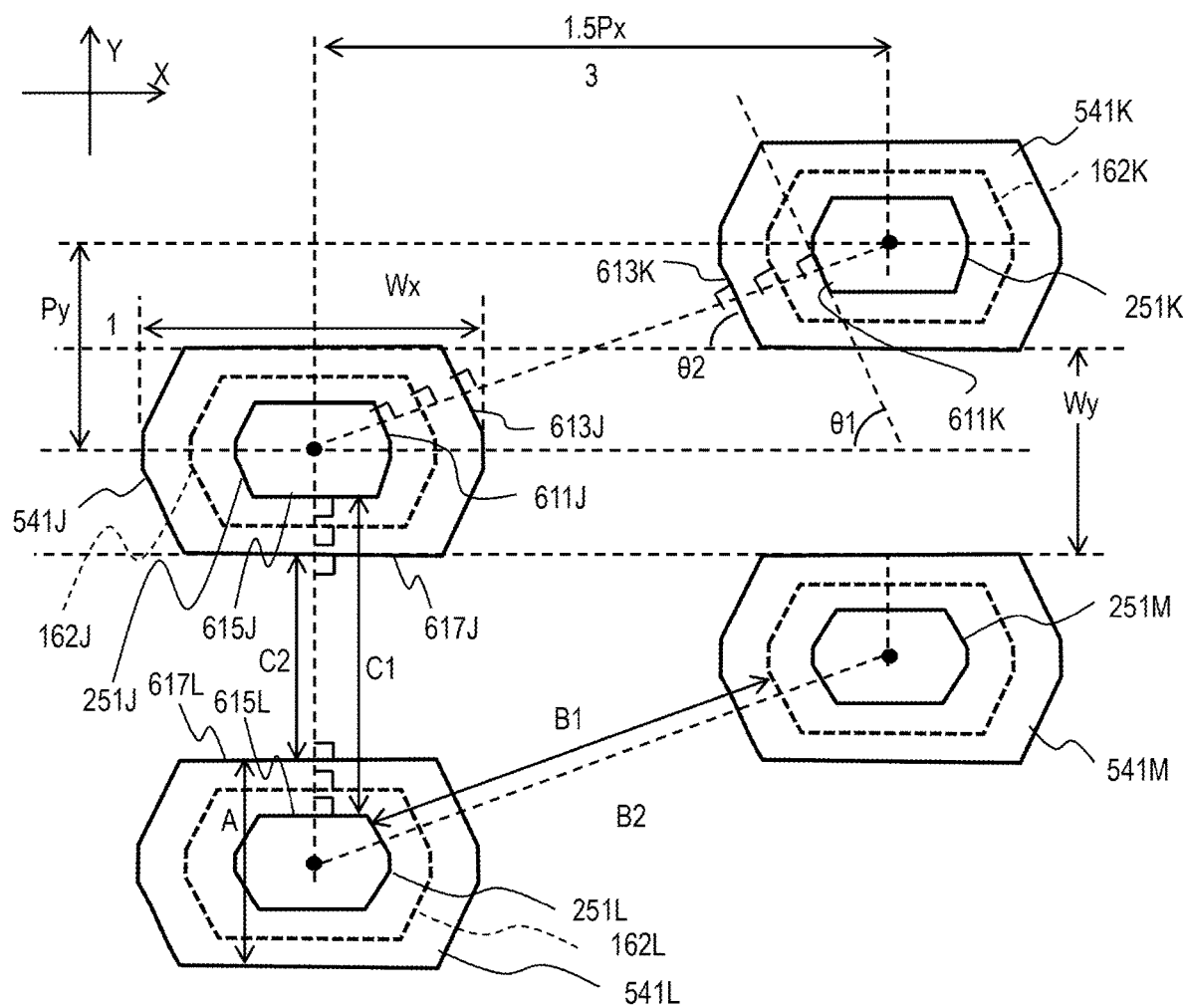
FIG. 18 illustrates a layout of pixels of one of the colors of red, green, and blue, anode electrodes thereof, and FMM openings therefor for the delta-nabla horizontal direction ⅔ pixel rendering.

FIG. 18 illustrates a layout of pixels of one of the colors of red, green, and blue, anode electrodes thereof, and FMM openings therefor for the delta-nabla horizontal direction ⅔ pixel rendering. The following description applies to the pixel patterns of all colors of red, green and blue. In the following, differences from the layout for the real resolution described with reference to FIG. 7 are mainly described.

Like the layout for the real resolution, the line (the centroid connecting line) connecting the centroid of the pixel 251J and the centroid of the pixel 251K intersects perpendicularly (at 90.0 degrees) with the sides 611J and 611K opposed to each other. As described above, the ratio of the pixel pitch Px in the row direction to the pixel pitch Py in the column direction is 2 to 1, unlike the layout for the real resolution. Accordingly, the angle θ1 between the side 611K and the row direction (the X-axis) is 71.6 degrees. The angle between the side 611J and the row direction (the X-axis) is also θ1=71.6 degrees.

Like the layout for the real resolution, the line (the centroid connecting line) connecting the centroid of the FMM opening 541J and the centroid of the FMM opening 541K intersects perpendicularly (at 90.0 degrees) with the sides 613J and 613K opposed to each other.

The distance in the row direction (X-axis direction) between the centroid of the FMM opening 541J and the centroid of the FMM opening 541K is 1.5Px. The distance in the column direction (Y-axis direction) between the centroid of the FMM opening 541J and the centroid of the FMM opening 541K is Py.

Furthermore, the angle between the side 613J and the line (centroid connecting line) connecting the centroid of the FMM opening 541J and the centroid of the FMM opening 541K is 90.0 degrees. Accordingly, the angle θ2 between the side 613K and the row direction (the X-axis) is 71.6 degrees. The angle between the side 613J and the row direction (the X-axis) is also θ2=71.6 degrees.

The description provided with reference to FIG. 11 or 12 is applicable to the FMM opening layout for the delta-nabla horizontal direction ⅔ pixel rendering. In the FMM opening layout for the delta-nabla horizontal direction ⅔ pixel rendering, the bridge width C2 in the column direction is (2Py−2r1). The bridge width B2 in the oblique direction is (Py√10−2r2). As illustrated in FIG. 18, in a right triangle having the hypotenuse of the centroid connecting line between two pixels, the relation among the base, the short side (height), and the hypotenuse is 3 (indicated as 3 in FIG. 18): 1 (indicated as 1 in FIG. 18): √10, and a half of the width of an opening in the direction along the centroid connecting line is r2 (see FIG. 11); accordingly the bridge width B2 in the oblique direction can be expressed as above.

Accordingly, to prevent deformation of the FMM, it is preferable that the layout of hexagonal or octagonal FMM openings satisfy the following condition;

Bridge width $B2=(Py\sqrt{10}-2r2) \geq$ Narrowest width $A$ of FMM opening=$2r1$.

To prevent deformation of the FMM, it is preferable to further satisfy the following condition:

Bridge width $C2=(2Py-2r1) \geq$ Narrowest width $A$ of FMM opening=$2r1$.

As to the layout of true circular FMM openings, it is preferable to satisfy the following condition:

Bridge width $B2=(Py\sqrt{10}-2r) \geq$ Narrowest width $A$ of FMM opening=$2r$.

To prevent deformation of the FMM, it is preferable to further satisfy the following condition:

Bridge width $C2=(2Py-2r) \geq$ Narrowest width $A$ of FMM opening=$2r$.

The foregoing description is applicable to the layout of the pixels of the same color and the layout of the anode electrodes of the pixels of the same color. As described above, the disposition of the centroids of the pixels of the same color is the same as the disposition of the centroids of the FMM openings and the shape of the pixels is smaller than and similar to the shape of the FMM openings. Accordingly, it is preferable that the distance B1 between the perimeters of the pixels of the same color adjacent to each other in an oblique direction or the distance C1 between the perimeters of the pixels of the same color adjacent to each other in the column direction be equal to or longer than the narrowest pixel width. The same applies to the anode electrodes.

As set forth above, embodiments of this invention have been described; however, this invention is not limited to the foregoing embodiments. Those skilled in the art can easily modify, add, or convert each element in the foregoing embodiment within the scope of this invention. A part of the configuration of one embodiment can be replaced with a configuration of another embodiment or a configuration of an embodiment can be incorporated into a configuration of another embodiment. For the angle θ, 63.4 degrees, 53.1 degrees, and 71.6 degrees are exemplified: the angle may be in a certain range because of the manufacturing step or the manufacturing conditions.

APPENDIX

Hereinafter, some features of this disclosure are provided as supplemental.

(1) A mask to be used in vapor deposition of an organic light-emitting material onto a substrate, the mask having a plurality of openings, wherein the plurality of openings are provided in a plurality of rows, wherein the openings in each of the plurality of rows are disposed at regular distances, wherein the plurality of openings have the same shape that is symmetric about a given line passing through the centroid thereof, wherein the centroids of the openings in each of the plurality of rows are located on a line extending in a first direction, wherein distances between lines passing through the centroids of the openings in each of the plurality of rows are uniform, wherein, in each pair consisting of two rows adjacent to each other in the plurality of rows, each of the openings in one of the two rows is located at the center between openings in the other row, wherein the shortest distance between a perimeter of a first opening in one of the plurality of rows and a perimeter of a second opening that is closest to the first opening in a row adjacent to the row including the first opening is a distance B2 between a point where a centroid connecting line connecting the centroid of the first opening and the centroid of the second opening intersects with the perimeter of the first opening and a point where the centroid connecting line intersects with the perimeter of the second opening, and wherein the distance B2 is equal to or longer than the narrowest width of the first opening.

(2) The mask according to the foregoing (1), wherein the shortest distance between a perimeter of the first opening and a perimeter of a third opening that is adjacent to the first opening in a second direction perpendicular to the first direction is a distance C2 between a point where a centroid connecting line connecting the centroid of the first opening and the centroid of the third opening intersects with a side of the first opening and a point where the centroid connecting line intersects with a side of the third opening facing the side of the first opening, and wherein the distance C2 is equal to or longer than the narrowest width of the first opening.

(3) The mask according to the foregoing (1), wherein each opening has a true circular shape, and wherein the following relation is satisfied:

$4r \leq p\sqrt{5}$, where r represents the radius of the true circle and p represents the distance between rows of openings and ¼ of the distance between openings in a row.

(4) The mask according to the foregoing (3), wherein the following relation is further satisfied:

$2r \leq p$.

(5) The mask according to the foregoing (1), wherein each opening has an octagonal or hexagonal shape having two sides parallel to the first direction, and wherein the following relation is satisfied:

$2(r1+r2) \leq p\sqrt{5}$, where r1 represents a half of the width in the second direction of the opening, r2 represents a half of the width of the opening in the direction along the centroid connection line, and p represents the distance between rows of openings and ¼ of the distance between openings in a row.

(6) The mask according to the foregoing (5), wherein the following relation is further satisfied:

$2r1 \leq p$.

(7) The mask according to the foregoing (1), wherein each opening has a true circular shape, and wherein the following relation is satisfied:

$4r \leq 5p/2$, where r represents the radius of the true circle, and p represents the distance between rows of openings and ⅜ of the distance between openings in a row.

(8) The mask according to the foregoing (7), wherein the following relation is further satisfied:

$4r \leq 3p$.

(9) The mask according to the foregoing (1), wherein each opening has an octagonal or hexagonal shape including two sides parallel to the first direction, and wherein the following relation is satisfied:

$2(r1+r2) \leq 5p/2$, where r1 represents a half of the width in the second direction of an opening, r2 represents a half of the width of the opening in the direction along the centroid connecting line, and p represents the distance between rows of openings and ⅜ of the distance between openings in a row.

(10) The mask according to the foregoing (9), wherein the following relation is further satisfied:

$4r1 \leq 3p$.

What is claimed is:

1. An OLED display device comprising:
a plurality of pixels of a first color;
a plurality of pixels of a second color; and
a plurality of pixels of a third color,
wherein the plurality of pixels of the first color, the plurality of pixels of the second color, and the plurality of pixels of the third color are provided in a plurality of pixel rows,
wherein each of the plurality of pixel rows includes pixels disposed cyclically in order of the first color, the second color, and the third color at regular distances,
wherein the plurality of pixels of the first color, the plurality of pixels of the second color, and the plurality of pixels of the third color have the same polygonal shape that is symmetric about a line passing through the centroid thereof,
wherein the centroids of the pixels in each of the plurality of pixel rows are located on a line extending in a first direction,
wherein distances between lines passing through the centroids of the pixels in each of the plurality of pixel rows are uniform,
wherein, in each pair consisting of two pixel rows adjacent to each other in the plurality of pixel rows, each of the pixels of the first color in a first pixel row of the pair of the two pixel rows is located at the center in the first direction between pixels of the first color adjacent to each other in a second pixel row of the pair of the two pixel rows,
wherein the shortest distance between a perimeter of a first pixel of each of the first color, the second color, and the third color and a perimeter of a second pixel of the same color as the first pixel that is closest to the first pixel in a pixel row adjacent to the pixel row including the first pixel is a distance between a first point and a second point, the first point being where a centroid connecting line connecting the centroid of the first pixel and the centroid of the second pixel intersects with a side of the first pixel opposed to a side of the second pixel, the second point where the centroid connecting line intersects with the side of the second pixel opposed to the side of the first pixel, and
wherein the side of the first pixel and the side of the second pixel opposed to each other are perpendicular to the centroid connecting line.

2. The OLED display device according to claim 1, wherein an angle between the first direction and each of the sides opposed to each other is one of 63.4 degrees, 53.1 degrees, and 71.6 degrees.

3. The OLED display device according to claim 1, wherein the polygonal shape is an octagon or a hexagon including two sides parallel to the first direction.

4. The OLED display device according to claim 1, wherein lower electrodes of the pixels in the plurality of pixel rows have a shape larger than and similar to the polygonal shape, and wherein the centroids of the pixels in the plurality of pixel rows are located at the same points as the centroids of the lower electrodes of the pixels when seen in a stacking direction.

* * * * *